United States Patent
Kidoguchi et al.

(10) Patent No.: US 6,444,485 B1
(45) Date of Patent: Sep. 3, 2002

(54) SEMICONDUCTOR LASER AND OPTICAL DISK DEVICE USING THE LASER

(75) Inventors: Isao Kidoguchi, Kawanishi; Hideto Adachi, Ibaraki; Masaya Mannoh, Nara; Toshiya Fukuhisa, Ibaraki; Akira Takamori, Suita, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/545,734

(22) Filed: Apr. 10, 2000

Related U.S. Application Data

(62) Division of application No. 09/051,014, filed as application No. PCT/JP96/02666 on Sep. 17, 1996, now Pat. No. 6,373,874.

(30) Foreign Application Priority Data

| Sep. 29, 1995 | (JP) | 7-252706 |
| Sep. 29, 1995 | (JP) | 7-252707 |
| Jan. 17, 1996 | (JP) | 8-006157 |
| Jan. 17, 1996 | (JP) | 8-006158 |
| Aug. 7, 1996 | (JP) | 8-208645 |

(51) Int. Cl.[7] ............................................. H01L 21/00

(52) U.S. Cl. .................. 438/31; 438/22; 438/48; 372/44; 372/45; 372/46; 372/50

(58) Field of Search ....................... 438/22, 31, 48; 372/44, 45, 46, 50

(56) References Cited

U.S. PATENT DOCUMENTS

| 4,817,110 A | 3/1989 | Tokuda et al. ............... 372/45 |
| 5,140,149 A | 8/1992 | Sakata et al. ............. 250/211 J |
| 6,195,374 B1 | 2/2001 | Kidogushi et al. ............ 372/45 |

FOREIGN PATENT DOCUMENTS

| JP | 61-135175 | 6/1986 | |
| JP | 63-202083 | 8/1988 | |
| JP | 2-153584 | 6/1990 | |
| JP | 4-162687 | 6/1992 | |
| JP | 5-327131 | 12/1993 | |
| JP | 6-194405 | 7/1994 | |
| JP | 6-260716 | 9/1994 | |
| JP | 6-350187 | 12/1994 | |
| JP | 7-22695 | 1/1995 | |
| JP | 7-86676 | 3/1995 | |
| JP | 7-169056 | 7/1995 | |
| JP | 7-263794 | 10/1995 | |
| JP | 08-222801 | * 8/1996 | ............ H01S/3/18 |
| JP | 09-191160 | * 7/1997 | |

OTHER PUBLICATIONS

International Search Report for PCT/JP96/02666 dated Dec. 3, 1996.

R. C. P. Hoskens et al., "Self–pulsating lasers with quantum well saturable absorber", Appl. Phys. Lett. 67(10), Sep. 4, 1995, pp. 1343–1345.

*Primary Examiner*—Long Pham
*Assistant Examiner*—Hsien-Ming Lee
(74) *Attorney, Agent, or Firm*—RatnerPrestia

(57) ABSTRACT

An n-type GaAs buffer layer 702, an n-type AlGaInP cladding layer 703, a multiple quantum well active layer 704 made of AlGaInP and GaInP, a first p-type AlGaInP cladding layer 705a, an optical guide layer 707, a second p-type cladding layer 705b, a p-type GaInP saturable absorption layer 706, and a third p-type AlGaInP cladding layer 707 are sequentially formed on an n-type GaAs substrate 701. In this structure, the volume of the saturable absorption layer is reduced, and the optical guide layer is provided. As the volume of the saturable absorption layer becomes smaller, the more easily the carrier density can be increased, the more easily the saturated state can be attained, and the more remarkable the saturable absorption effect becomes. Thus, a semiconductor laser having stable self-oscillation characteristics and, as a result, having a low relative noise intensity is realized.

5 Claims, 18 Drawing Sheets

OTHER PUBLICATIONS

I. Kidoguchi et al., "Stable operation of self-sustained pulsation in 650–nm–band AlGaInP visible lasers with highly doped saturable absorbing layer", Appl. Phys. Lett. 68(25), Jun. 17, 1996, pp. 3543–3545.

N. Hayashi et al., "Low–noise, high–power laser diode with a saturable absorbing layer", The Institute of Electronics, Information and Communication Engineers, Technical Report of IBICE, LQE95–2 (May 1995), pp. 7–12.

Translation of Notice from Office Action dated Apr. 24, 1998 for corresponding Taiwan Patent Application 85111627.

(26p–ZA–6) T. Fukuhisa et al., "Self–Sustained Pulsation in 650nm–Band Laser Diodes with Highly Doped Saturable Absorbing Layer", Matsushita Elec. Ind. Co., Ltd., Semiconductor Research Center, p. 902, 1995.

(26a–C–10) H. Adachi et al., "Influence of Saturable Absorbing Layer on Self–Sustained Pulsation Characteristics", Matsushita Electric Industrial Co., Ltd., Semiconductor Research Center, p. 1024, 1996.

Hideto Adachi et al., "Self–Sustained Pulsation in 650nm–Band A1GaInP Visible Laser Diodes with Highly Doped Saturable Absorbing Layer", 2419A International Conference on Solid State Devices & Materials, pp. 437–439, Aug. 21, 1995.

European Search Report dated Nov. 5, 1998 for corresponding European Patent Application No. 96931223.0.

\* cited by examiner

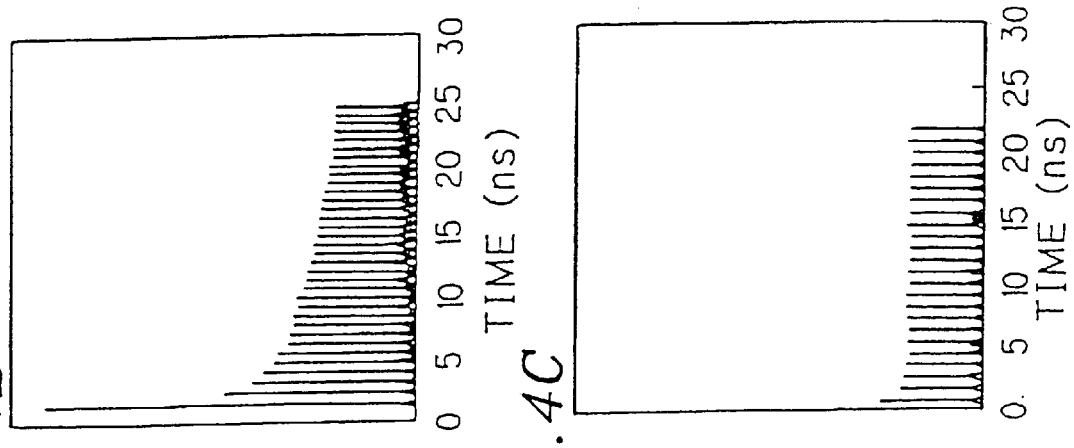
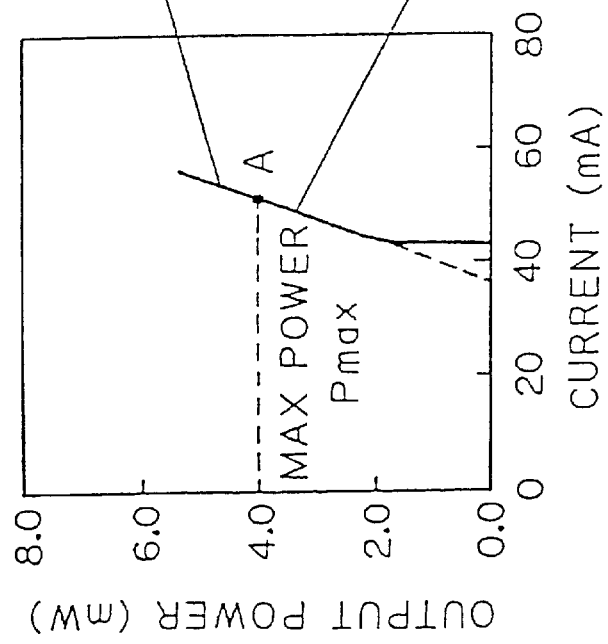
FIG. 4B
FIG. 4C
FIG. 4A

Active layer — Optical guide layer

Saturable absorption layer

SEMICONDUCTOR LASER AND OPTICAL DISK DEVICE USING THE LASER

This application is a divisional of U.S. patent application Ser. No. 09/051,014 filed on Aug. 14, 1998 now U.S. Pat. No. 6,373,874, which is a U.S. National Phase Application of PCT International Application PCT/JP96/02666.

The entire disclosure of U.S. patent application Ser. No. 09/051,014 filed on Aug. 14, 1998 (which is a U.S. National Phase Application of PCT International Application PCT/JP96/02666) is expressly incorporated by reference herein.

TECHNICAL FIELD

The present invention relates to a self-oscillation type semiconductor laser used as a light source for an optical disk system and an optical disk device using such a semiconductor laser.

BACKGROUND ART

With the recent increase in demand for semiconductor lasers in the fields of optical communications, laser printers, optical disk devices, and the like, semiconductor lasers of the GaAs type and the InP type, mainly, have been actively studied and developed. In the optical information processing field, a method of recording and reproducing information using light from an AlGaAs type semiconductor laser with a wavelength of 780 nm, especially, has been commercialized. Such a method has been widely used for compact disks and the like.

In recent years, optical disk devices with a larger memory capacity have been increasingly in demand. With this demand, shorter-wavelength lasers have been requested. An AlGaInP type semiconductor laser can oscillate in the red region of wavelengths of 630 to 690 nm, emitting light with the shortest wavelength among those obtained from semiconductor lasers practically available at present. This type of semiconductor laser is therefore highly expected to be a next-generation large-capacity light source for optical information recording, replacing the conventional AlGaAs type semiconductor laser. In general, when reproducing information from an optical disk, a semiconductor laser generates intensity noise due to return of light reflected from a disk surface and temperature change, inducing a signal read error. A laser with low intensity noise is therefore indispensable for a light source of an optical disk.

Conventionally, in order to reduce noise, a low-output AlGaAs type semiconductor laser for a reproduction-only device has a structure where saturable absorbers are intentionally formed on each side of a ridge stripe. With this structure, multiple longitudinal modes can be obtained. In the case where disturbances such as return light and temperature change arise when a laser is oscillated in a single longitudinal mode, oscillation in an adjacent longitudinal mode is started by a minute change in a gain peak, causing conflict with the oscillation in the original oscillating mode and thus leading to noise. When multiple longitudinal modes are used, the change in the intensity of each mode is averaged and is not influenced by the disturbances. Thus, stable low-noise characteristics can be obtained.

A method for obtaining further stable self-oscillation characteristics is disclosed in Japanese Laid-Open Publication No. 63-202083. In this publication, a self-oscillation type semiconductor laser has been realized by forming a layer which can absorb output light.

Japanese Laid-Open Publication No. 6-260716 reports that the characteristics have been improved by substantially equalizing the energy gaps of an active layer and an absorption layer. In particular, the energy gaps of a strained quantum well active layer and a strained quantum well saturable absorption layer are substantially equal to each other, so as to obtain good self-oscillation characteristics. A similar configuration is described in Japanese Laid-Open Publication No. 7-22695.

However, the inventors of the present invention have found that good self-oscillation characteristics are not obtained by only substantially equalizing the energy gaps of a saturable absorption layer and an active layer.

The present invention is aimed at providing a semiconductor laser having stable self-oscillation characteristics effective for noise reduction by examining the energy gap difference between a saturable absorption layer and an active layer, as well as a method for fabricating such a semiconductor laser and an optical disk device using such a semiconductor laser.

DISCLOSURE OF THE INVENTION

The semiconductor laser of this invention includes an active layer having a quantum well layer and a cladding structure sandwiching the active layer, wherein the cladding structure includes a saturable absorption layer and an optical guide layer for increasing a confinement factor of the saturable absorption layer, and the energy gap of the saturable absorption layer is smaller than the energy gap between ground states of the quantum well layer of the active layer by 30 to 200 meV, whereby the above objective is attained.

Preferably, the thickness of the saturable absorption layer is in a range of about 10 to about 100 Å.

A plurality of saturable absorption layers may be formed.

Preferably, the energy gap of the saturation absorption layer is smaller than the energy gap between ground states of the quantum well layer of the active layer by 50 to 100 meV.

Preferably, the optical guide layer has a band gap which is larger than a band gap of the saturable absorption layer and smaller than band gaps of the other layers of the cladding structure.

Preferably, the thickness of the optical guide layer is in a range of 300 to 1200 Å.

The optical guide layer may be divided into a plurality of portions in the cladding structure.

The optical guide layer may be adjacent to the saturable absorption layer in the cladding structure.

Preferably, the saturable absorption layer is doped with impurities of $1 \times 10^{18}$ cm$^{-3}$ or more.

Preferably, the active layer has a multiple quantum well structure.

In the method for fabricating a semiconductor laser according to the present invention, the semiconductor laser includes an active layer having a quantum well layer and a cladding structure sandwiching the active layer, the cladding structure including a saturable absorption layer and an optical guide layer for increasing a confinement factor of the saturable absorption layer, the energy gap of the saturable absorption layer being smaller than the energy gap between ground states of the quantum well layer of the active layer by 30 to 200 meV, characteristics of the semiconductor laser varying with time after start of laser oscillation but being substantially fixed after a lapse of about one minute. The method includes the stabilizing step for varying the characteristics obtained immediately after the start of laser oscillation to obtain the substantially fixed characteristics, whereby the above objective is attained.

In one embodiment, the characteristics are current-light output power characteristics.

In one embodiment, the stabilizing step comprises the step of reducing a threshold current by an aging process.

In one embodiment, the stabilizing step comprises the step of reducing a threshold current by annealing.

In one embodiment, the threshold current is reduced from a value obtained immediately after the start of laser oscillation by 5 mA or more by the stabilizing step.

The optical disk device according to the present invention includes: a semiconductor laser; a converging optical system for converging a laser beam emitted from the semiconductor laser on a recording medium; and an optical detector for detecting the laser beam reflected from the recording medium, wherein the semiconductor laser includes an active layer having a quantum well layer and a cladding structure sandwiching the active layer, the cladding structure including a saturable absorption layer and an optical guide layer for increasing a confinement factor of the saturable absorption layer, and the energy gap of the saturable absorption layer is smaller than the energy gap between ground states of the quantum well layer of the active layer by 30 to 200 meV, whereby the above objective is attached.

In one embodiment, the semiconductor laser oscillates in a single mode when information is recorded on the recording medium, and operates in a self-oscillation mode when information recorded on the recording medium is reproduced.

In one embodiment, the optical detector is disposed near the semiconductor laser.

In one embodiment, the optical detector includes a plurality of photodiodes formed on a silicon substrate, and the semiconductor laser is disposed on the silicon substrate.

In one embodiment, the silicon substrate includes a concave portion formed on a principal surface thereof and a micromirror formed on a side wall of the concave portion, the semiconductor laser is disposed in the concave portion, and the angle formed between the micromirror and the principal surface is set so that the laser beam emitted from the semiconductor laser proceeds in a direction substantially vertical to the principal surface of the silicon substrate after being reflected from the micromirror.

In one embodiment, a metal film is formed on a surface of the micromirror.

In one embodiment, the active layer and the cladding structure are formed of $Al_xGa_yIn_{1-x-y}P$ material ($0 \leq x \leq 1$, $0 \leq y \leq 1$, where x and y are not zero simultaneously).

Alternatively, the semiconductor laser of the present invention includes an active layer including a quantum well layer and a saturable absorption layer, wherein the energy gap of the saturable absorption layer is smaller than the energy gap between ground states of the quantum well layer of the active layer by 30 to 200 meV, whereby the above objective is attained.

Alternatively, the semiconductor laser of the present invention includes an active layer including a quantum well layer and a cladding structure sandwiching the active layer, wherein the cladding structure includes a saturable absorption layer, and the energy gap of the saturable absorption layer is smaller than the energy gap between ground states of the quantum well layer of the active layer by 30 to 200 meV, whereby the above objective is attained. Preferably, the thickness of the saturable absorption layer is in the range of about 10 to about 100 Å.

A plurality of saturable absorption layers may be formed.

Preferably, the energy gap of the saturation absorption layer is smaller than the energy gap between ground states of the quantum well layer of the active layer by 50 to 100 meV.

Preferably, the saturable absorption layer is doped with impurities of $1 \times 10^{18}$ cm$^{-3}$ or more.

Preferably, strain is applied to the quantum well layer and the saturable absorption layer.

Preferably, the active layer has a multiple quantum well structure.

BRIEF DESCRIPTION OF THE DRAWINGS

FIG. 4A is a light output power characteristics diagram indicating $P_{max}$.

FIG. 4B is a diagram illustrating changes in the light output power with time when the light output power is more than $P_{max}$.

FIG. 4C is a diagram illustrating changes in the light output power with time when the light output power is less than $P_{max}$.

BEST MODE FOR CARRYING OUT THE INVENTION

Hereinbelow, the present invention will be described in detail by way of examples.

EXAMPLE 1

Figure 1:
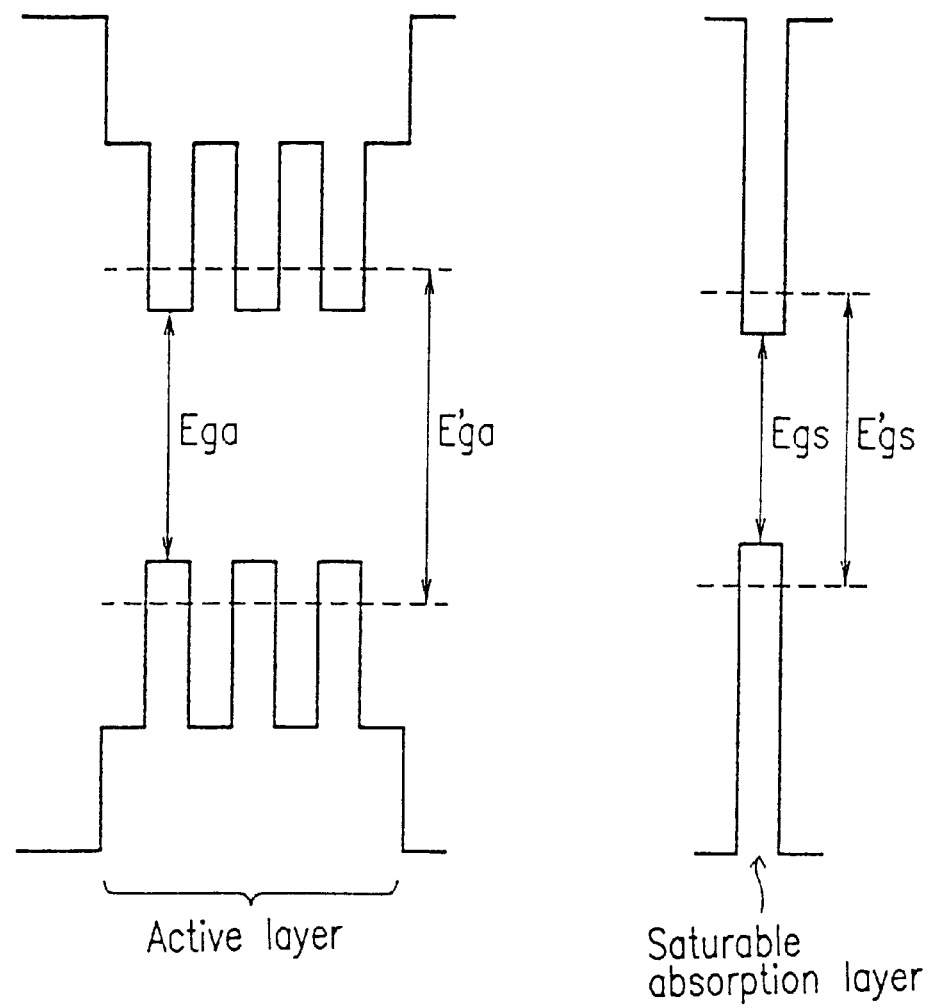
FIG. 1 is a schematic view illustrating energy gaps.

The inventors of the present invention have examined the relationship between the "energy gap difference ($\Delta E$) between an active layer and a saturable absorption layer" and self-oscillation. As used herein, the energy gap difference ($\Delta E$) between an active layer and a saturable absorption layer means the "value obtained by subtracting an energy gap ($E'_{gs}$) between ground states of the saturable absorption layer from an energy gap ($E'_{ga}$) between ground states of a quantum well layer of an active layer before laser oscillation ($E'_{ga}-E'_{gs}$)", when both the active layer and the saturable absorption layer are of a quantum well structure. The relationships between these energy gaps and band gaps ($E_{ga}$, $E_{gs}$) of these layers are schematically shown in FIG. 1. In general, in a semiconductor layer of the quantum well structure, the energy gap between ground states does not correspond to an energy gap between the bottom of a conduction band and the bottom of a valence band, but an energy difference ($E'_g$) between quantum levels of these bands. The energy gap is therefore larger than a normal band gap ($E_g$) by about 70 meV.

In the case where the active layer is of a quantum well structure while the saturable absorption layer is of a bulk structure, the energy gap difference between the active layer and the saturable absorption layer means the "value obtained by subtracting the band gap ($E_{gs}$) of the saturable absorption layer from the energy gap ($E'_{ga}$) between ground states of the active layer before laser oscillation".

According to the present invention, the saturable absorption layer may be of the quantum well structure or of the bulk structure. Accordingly, the "energy gap of the saturable absorption layer" as used herein is defined as follows for convenience. That is, it means the "energy gap ($E'_{gs}$) between ground states" when the saturable absorption layer is of the quantum well structure, while meaning the "band gap (Egs) thereof" when the saturable absorption layer is of the bulk structure. By using the thus-defined "energy gap of the saturable absorption layer", the "energy gap difference between the active layer and the saturable absorption layer" can be expressed as the "value obtained by subtracting the energy gap of the saturable absorption layer from the energy gap between ground states of the quantum well layer of the active layer before laser oscillation".

The inventors of the present invention have examined and found that stable self-oscillation can be obtained by setting the energy gap difference ($\Delta E$) between the active layer and the saturable absorption layer at 30 meV to 200 meV. This is because, in the above range of the energy gap difference, the saturable absorption layer efficiently absorbs laser light while the light absorption is saturated. No self-oscillation is obtained when the energy gap difference ($\Delta E$) between the active layer and the saturable absorption layer is less than 30 meV. This is probably because, with such small energy gap difference, the saturable absorption layer does not absorb much laser light. Furthermore, no self-oscillation occurs when the energy gap difference ($\Delta E$) exceeds 200 meV, because the saturable absorption layer absorbs too much light to exhibit the saturation characteristics. It is found therefore that the appropriate energy gap difference ($\Delta E$) is in the range of 30 to 200 meV.

Present crystal growth technology allows the energy gap of each semiconductor layer and the energy gap difference ($\Delta E$) among the layers to be controlled at a precision of several milli-electron volts or less. Therefore, if the energy gap difference ($\Delta E$) between the active layer and the saturable absorption layer is as large as 10 meV, it is interpreted that the energy gap difference ($\Delta E$) must have been formed intentionally between the active layer and the saturable absorption layer. Accordingly, when the energy gap difference ($\Delta E$) between the active layer and the saturable absorption layer is 10 meV or more, the energy gap between the ground states of the quantum well layer of the active layer and the energy gap of the saturable absorption layer are not "substantially the same".

When the energy gap difference ($\Delta E$) is in the range of 50 meV to 100 meV, especially, the saturation condition of the saturable absorption layer becomes optimal, allowing for stable self-oscillation even at a high operating temperature. As the energy gap difference ($\Delta E$) exceeds 100 meV, light absorption by the saturable absorption layer gradually increases, slightly increasing the operating current. The energy gap difference is therefore preferably 100 meV or less. Thus, with an energy gap difference in the range of 50 to 100 meV, the operating current of the semiconductor laser does not increase and good self-oscillation characteristics can be obtained. In particular, this setting of the energy gap difference in the above range is preferable when the semiconductor laser is expected to operate under the circumstance of a comparatively high temperature, such as in applications related to automobiles.

The carrier density of the saturated absorption layer can be easily increased by reducing the volume of the saturated absorption layer. Laser light output from the active layer is absorbed by the saturable absorption layer, generating pairs each formed of an electron and a hole. When the volume of the saturable absorption layer is small, the light absorption thereof per unit volume increases, easily resulting in increase of the carrier density thereof. The saturable absorption layer with a high carrier density can be easily saturated, exhibiting excellent saturable absorption effect. Accordingly, more strong and stable self-oscillation characteristics can be obtained as the saturable absorption layer becomes thinner. This has been confirmed by experiments of the inventors of the present invention. The thickness of the saturable absorption layer is preferably in the range of about 10 to 100 Å in order to obtain such strong and stable self-oscillation. This can also be obtained with a saturable absorption layer having the bulk structure with a thickness of over 100 Å as long as the energy gap difference is set within the preferable range. The saturable absorption layer may be divided into a plurality of sub-layers.

In the semiconductor laser of the present invention, an optical guide layer is formed having a cladding structure in order to overcome the following disadvantage. When the saturable absorption layer is made as thin as the quantum well layer in order to reduce the volume of the saturable absorption layer, the confinement factor within the saturable absorption layer is extremely reduced, and consequently, stable self-oscillation is not obtained. If the confinement factor of the saturable absorption layer increases to at least about 1.2% while that of the active layer is maintained at 5.0% or more, for example, by using the optical guide layer, stable self-oscillation can be obtained.

As described above, the optical guide layer of the present invention is formed to increase the confinement factor of the saturable absorption layer. It is disposed at a position apart from the active layer. The optical guide layer of the present invention is therefore largely different from a conventional optical guide layer disposed adjacent to an active layer to increase the confinement factor of the active layer.

The positional relationship between the saturable absorption layer and the optical guide layer is optimally determined in consideration of the volume and light confinement of the saturable absorption layer.

Now, the present invention will be described by way of examples with reference to the accompanying drawings.

EXAMPLE 1

Figure 2:
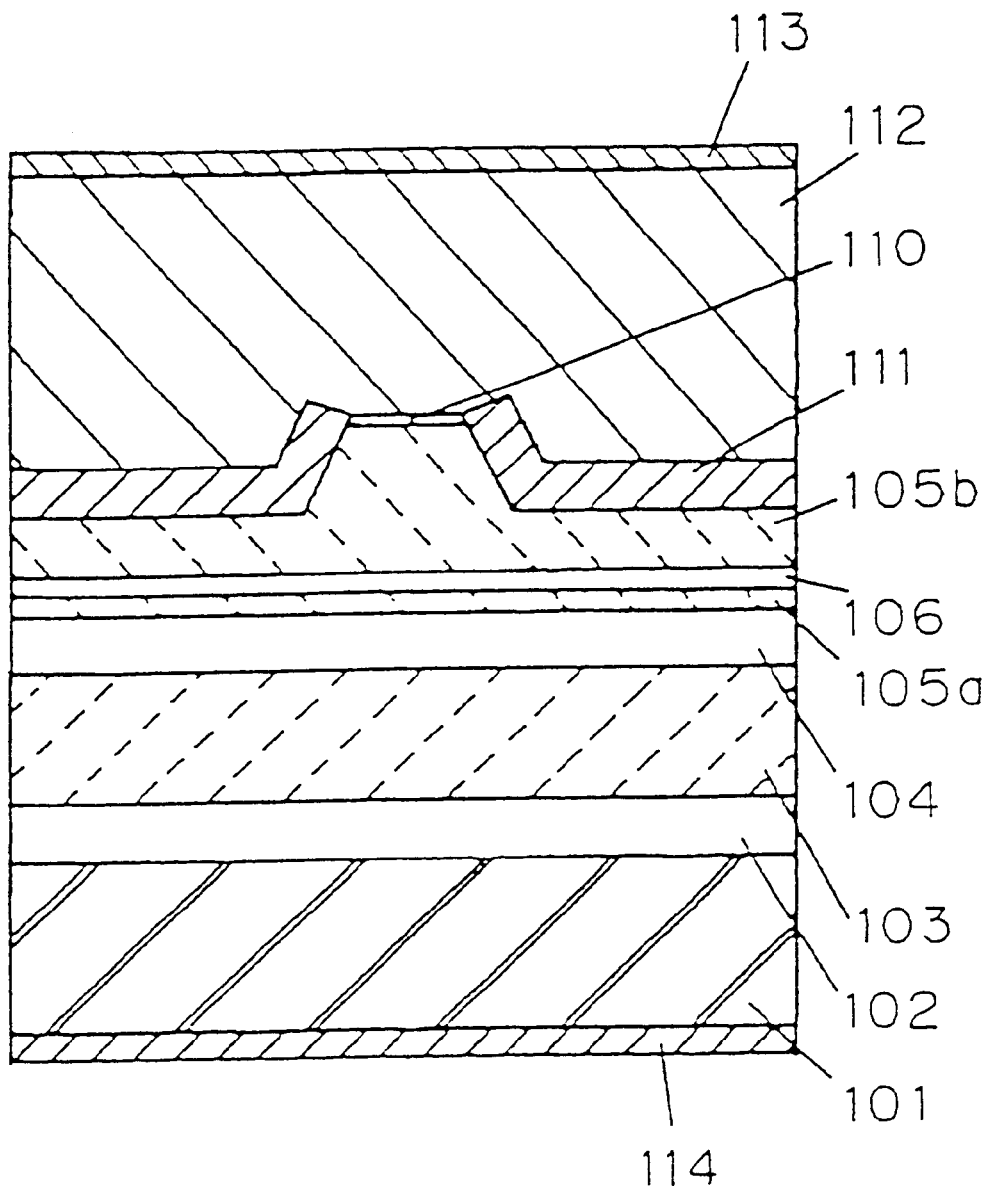
FIG. 2 is a sectional view of the first example of the semiconductor laser according to the present invention.

FIG. 2 is a sectional view of an example of the semiconductor laser according to the present invention. The semiconductor laser of this example includes an n-type GaAs substrate 101 and a semiconductor multilayer structure formed on the GaAs substrate 101. The semiconductor multilayer structure includes an n-type GaAs buffer layer 102, an n-type AlGaInP cladding layer 103, a multiple quantum well active layer 104 made of AlGaInP and GaInP, a first p-type AlGaInP cladding layer 105a, a saturable absorption layer 106 made of p-type GaInP, and a second p-type AlGaInP cladding layer 105b. A stripe ridge (width: about 2.0 to 7.0 µm) extending in a cavity length direction is formed in the upper portion of the second p-type cladding layer 105b. A contact layer 110 is formed on the top surface of the ridge of the second p-type cladding layer 105b. An n-type GaAs current blocking layer 111 is formed on the second p-type cladding layer 105b and the sides of the contact layer 111. A p-type GaAs cap layer 112 is formed over the contact layer 110 and the current blocking layer 111. A p-electrode 113 is formed on the top surface of the cap layer 112, while an n-electrode 114 is formed on the bottom surface of the substrate 101. The active layer 104 is of a multiple quantum well structure composed of three pairs of well layers and barrier layers.

Herein, the portions of the semiconductor multilayer structure except for the buffer layer, the active layer, the contact layer, the cap layer, and the current blocking layer are called a "cladding structure" as a whole. In this example, the n-type AlGaInP cladding layer 103, the first p-type AlGaInP cladding layer 105a, the saturable absorption layer 106, and the second p-type AlGaInP cladding layer 105b constitute the cladding structure.

The dope level and the film thickness of each semiconductor layer constituting the semiconductor multilayer structure are shown in Table 1 below.

TABLE 1

| Name | Ref. No. | Dope level (cm$^{-3}$) | Thickness |
|---|---|---|---|
| Cap layer | 112 | 5 × 10$^{18}$ | 3 µm |
| Contact layer | 110 | 1 × 10$^{18}$ | 500 Å |
| 2nd p-type cladding layer | 105b | 1 × 10$^{18}$ | 0.9 µm |
| Saturable absorption layer | 106 | 2 × 10$^{18}$ | 50 Å |
| 1st p-type cladding layer | 105a | 5 × 10$^{17}$ | 500 Å |
| Active layer | 104 | undoped | 500 Å |
| Barrier layer | | | 50 Å |
| Well layer | | | 50 Å |

TABLE 1-continued

| Name | Ref. No. | Dope level (cm$^{-3}$) | Thickness |
|---|---|---|---|
| N-type cladding layer | 103 | 5 × 10$^{17}$ | 1.0 µm |
| Buffer layer | 102 | 1 × 10$^{18}$ | 0.3 µm |

Figure 3:
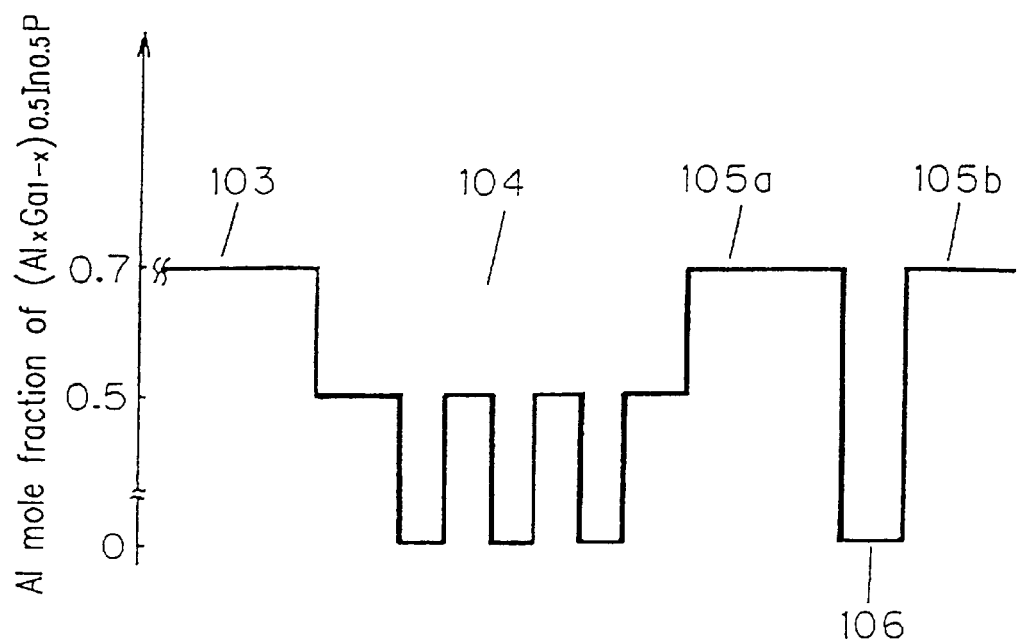
FIG. 3 is a band gap energy diagram of the first example.

FIG. 3 shows the distribution of an Al mole fraction x of $(Al_xGa_{1-x})_{0.5}In_{0.5}P$ of the portions of the semiconductor laser of this example covering the vicinity of the active layer through the vicinity of the saturable absorption layer. In this example, the Al mole fraction of the n-type cladding layer 103, the first p-type cladding layer 105a, and the second p-type cladding layer 105b is 0.7. Since the quantum well layers of the active layer 104 and the saturable absorption layer are made of $Ga_{0.45}In_{0.55}P$ and $Ga_{0.40}In_{0.60}P$, respectively, they have large lattice constants compared with the surrounding layers, resulting in receiving compressive strain.

The energy gap difference between the quantum well layers of the active layer 104 and the saturable absorption layer plays an important role in obtaining stable self-oscillation. In Example 1, the energy gap difference is 57 meV, allowing for stable self-oscillation.

The inventors of the present invention have examined the role of the saturable absorption layer and the energy gap difference, and the results will be described hereinbelow.

With reference to FIGS. 4A to 4C, as is observed from FIG. 4A, laser oscillation (self-oscillation) is started when the injected current reaches 40 mA. As the injected current is further increased, the self-oscillation is terminated at a point A of FIG. 4A and shifts to normal laser oscillation. The maximum light output power obtained by the self-oscillation is denoted by $P_{max}$. In the example shown in FIG. 4A, $P_{max}$ is 4.0 mW. The light output power greatly fluctuates with time as shown in FIG. 4C when the injected current is smaller than the current value with which $P_{max}$ is obtained, providing self-oscillation with a stable amplitude. However, when the current is larger than that current value with which $P_{max}$ is obtained, the amplitude of the light output power gradually decreases with time, and eventually shifts to normal laser oscillation, as shown in FIG. 4B.

The self-oscillation also tends to be terminated when the operating temperature T exceeds a certain level, as in the injected current. The maximum temperature at which the self-oscillation is observed is denoted by $T_{max}$, which is also the temperature at which the self-oscillation is terminated.

Figure 5:
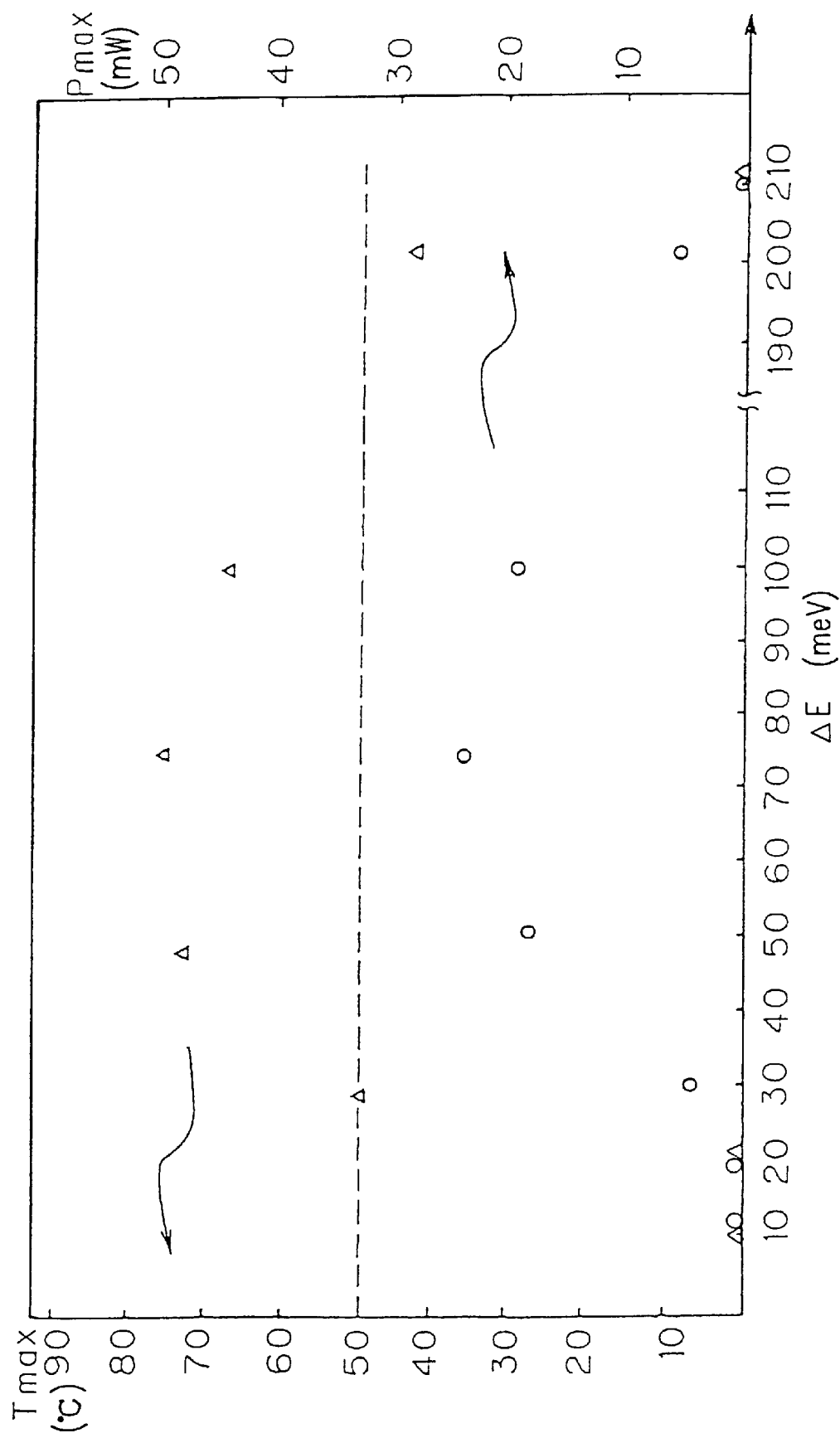
FIG. 5 is a $T_{max}$ and $P_{max}$ characteristics diagram for the first example according to the present invention.

FIG. 5 is a graph illustrating the results of experiments into the relationships between the energy gap difference (meV) as the X axis and $T_{max}$ (temperature at which self-oscillation is terminated) and $P_{max}$ (maximum light output power by self-oscillation at room temperature) as the Y axes. The experiment results show that no self-oscillation was observed when the energy gap difference was 10 meV or 20 meV, but observed when it was 30 meV. At the energy gap difference of 30 meV, self-oscillation was observed at a temperature as high as 51° C. and a light output power as high as 5 mW was obtained by self-oscillation.

The self-oscillation started when the energy gap difference reached 30 meV, and the self-oscillation was confirmed to have continued up to 200 meV. In particular, both $T_{max}$ and $P_{max}$ were high when the energy gap difference was in the range of 50 to 100 meV. This range is therefore confirmed to be the practically preferable range.

When the energy gap difference exceeds 100 meV, the absorption of laser light by the saturable absorption layer becomes large due to the large energy gap difference between the active layer and the saturable absorption layer, resulting in slightly increasing the operating current. This will be described with reference to FIG. 6.

Figure 6:
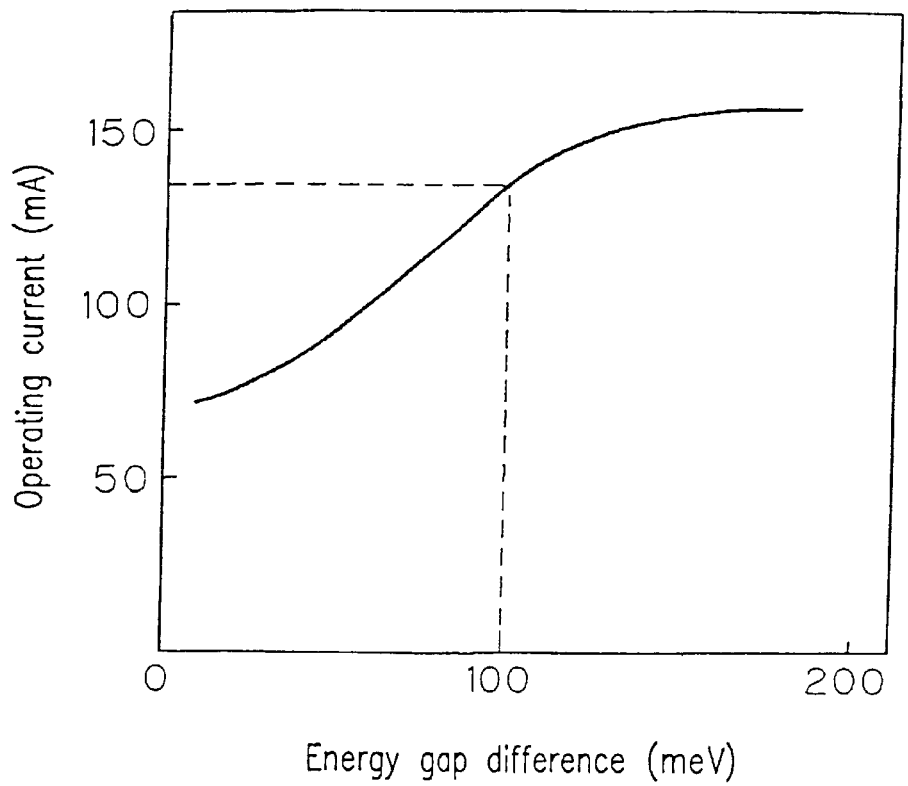
FIG. 6 is a characteristics diagram illustrating the relationship between the energy gap and the operating current.

FIG. 6 is a graph illustrating the relationship between the energy gap difference (meV) as the X axis and the operating current (mA) as the Y axis. As is observed from this graph, when the energy gap difference exceeds 100 meV, the operating current exceeds 130 mA.

Figure 7:
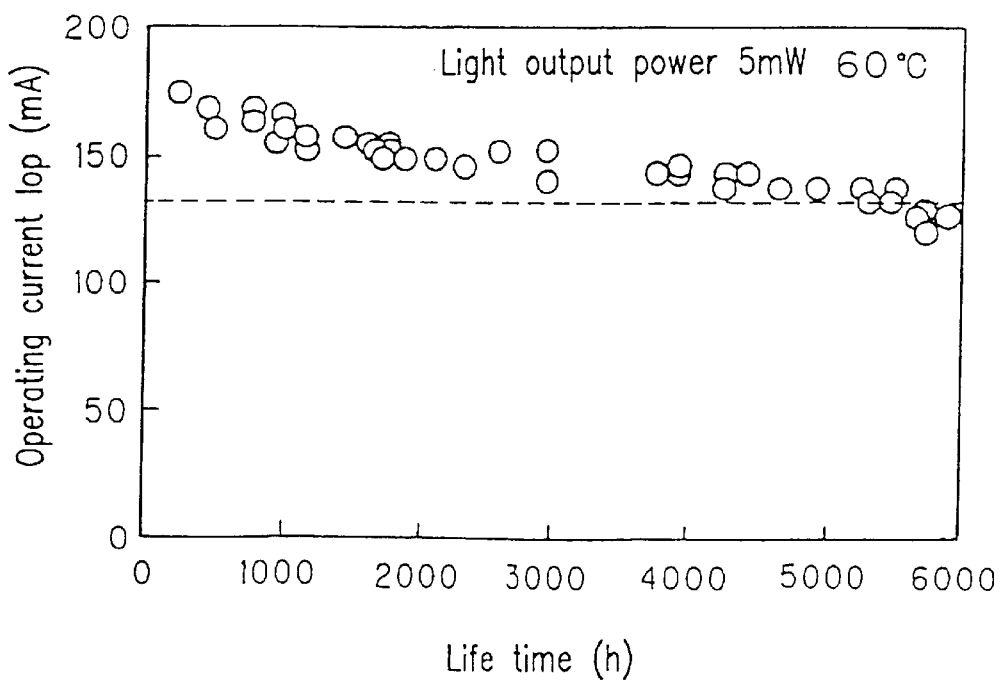
FIG. 7 is a characteristics diagram illustrating the relationship between the operating current and the life time.

FIG. 7 is a graph illustrating the relationship between the operating current and the life time of the semiconductor laser of this example. This graph is based on the measurement results obtained under the conditions where the light output power of the semiconductor laser is maintained at 5 mW and the operating temperature is 60° C. From FIG. 7 it is observed that the operating current should be set at 130 mA or less to obtain a life time of 5000 hours or more.

As is observed from FIGS. 6 and 7, the energy gap difference is preferably 100 meV or less in consideration of the life time of the semiconductor laser.

The compositions and the thicknesses of the active layer and the saturable absorption layer may be adjusted to set the energy gap difference ($\Delta E$) between the active layer and the saturable absorption layer within a predetermined range. For example, assuming that the active layer is of the quantum well structure and each well layer thereof is made of $Ga_{0.45}In_{0.55}P$ with a thickness of 50 Å ($E_{ga}$=1.937 eV, $\lambda$=640 nm), an energy gap difference ($\Delta E$) in the range of 30 meV to 200 meV can be obtained by adjusting the composition of the saturable absorption layer as shown in Table 2 below.

TABLE 2

(Active layer: $Ga_{0.45}In_{0.55}P$)

| $Ga_xIn_{1-x}P$ saturable absorption layer | Energy gap difference ($\Delta E$) |
|---|---|
| $Ga_{0.42}In_{0.5}P$ | 30 meV |
| $Ga_{0.40}In_{0.60}P$ | 50 meV |
| $Ga_{0.34}In_{0.66}P$ | 100 meV |
| $Ga_{0.24}In_{0.76}P$ | 200 meV |

The above Table 2 shows the values obtained when the thickness of the saturable absorption layer is 50 Å. As the thickness of the saturable absorption layer increases, the energy gap difference ($\Delta E$) increases. As the Ga mole fraction x of the saturable absorption layer increases, the energy gap difference ($\Delta E$) decreases. In contrast, as the thickness of the well layers of the active layer increases, the energy gap difference ($\Delta E$) decreases. As the Ga mole fraction x of the well layers increases, the energy gap difference ($\Delta E$) increases.

Figure 8:
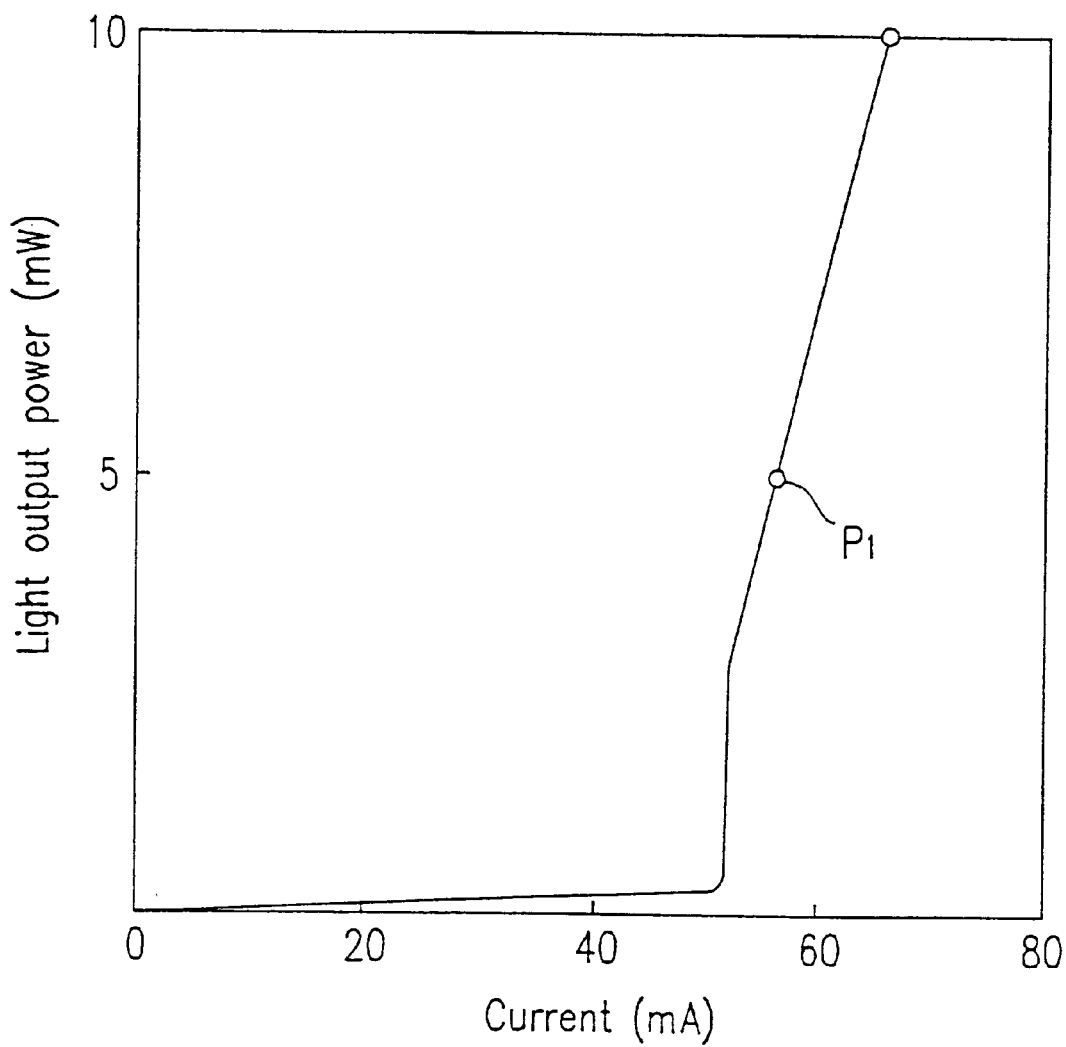
FIG. 8 is a light output power characteristics diagram of the first example according to the present invention.

FIG. 8 is a graph illustrating the current-light output power characteristics of the semiconductor laser of this example. The X axis of the graph represents the injected current to the semiconductor laser (mA), while the Y axis represents the light output power (mW). The threshold current is about 50 mA. A feature of the self-oscillation type semiconductor laser distinguished from normal semiconductor lasers is that the light output power sharply increases at and around the threshold current, as is observed from FIG. 8. This occurs because, with the existence of the saturable absorption layer, the light output power is not released outside until a sufficient amount of injected carriers are accumulated. When the injected current exceeds a certain value, laser oscillation is started, increasing the light output power in proportion to the injected current.

Figure 9:
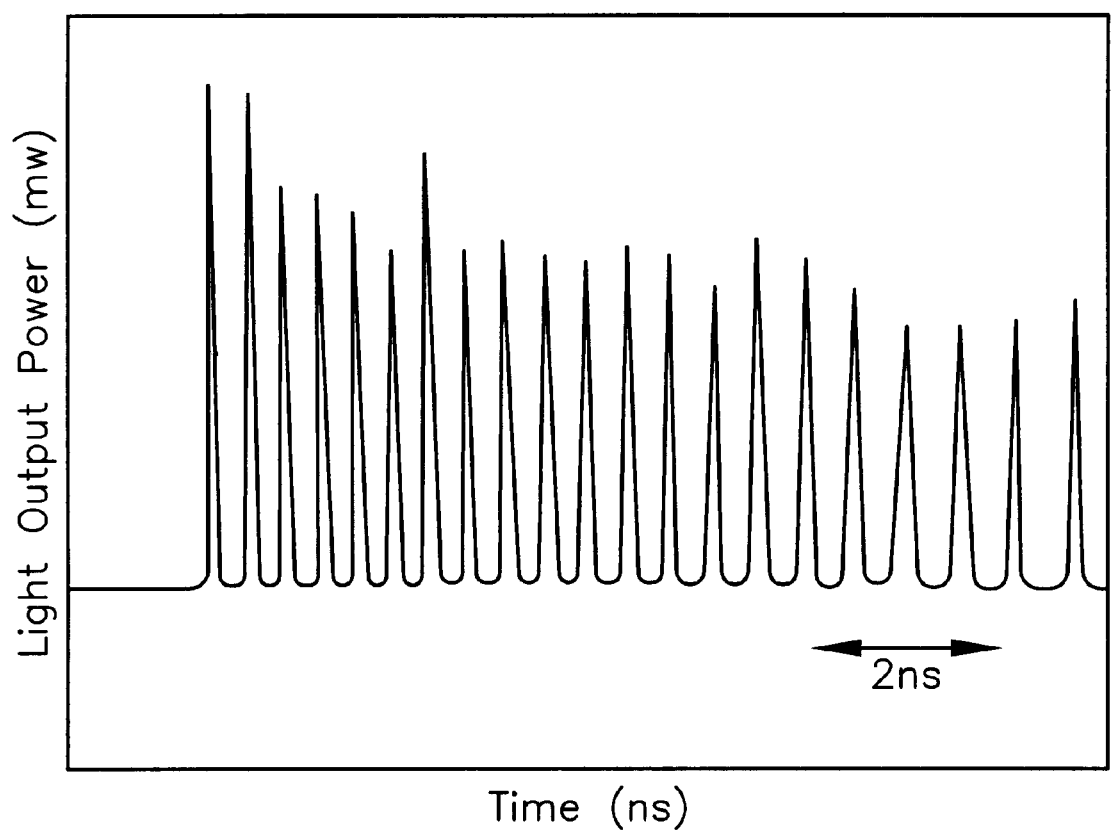
FIG. 9 is a diagram illustrating the change in the light output power with time of the first example according to the present invention.

FIG. 9 shows an output waveform of the semiconductor laser of this example at a point $P_1$ of FIG. 8. As is observed from FIG. 9, the light output power greatly fluctuates during a short period of 2 ns, indicating self-oscillation.

In the semiconductor laser according to the present invention, the dope level of the saturable absorption layer is set at $2\times10^{18}$ ($cm^{-3}$) so as to reduce the life time of carriers. This increases the contribution of spontaneous emission to the temporal change rate of the carrier density, facilitating the self-oscillation. A dope level of $1\times10^{18}$ ($cm^{-3}$) or more is effective in reducing the life time of carriers.

The thickness of the saturable absorption layer is not limited to 50 Å used in this example. The saturable absorption layer can also be of the multiple quantum well structure or of the bulk structure.

EXAMPLE 2

Figure 10:
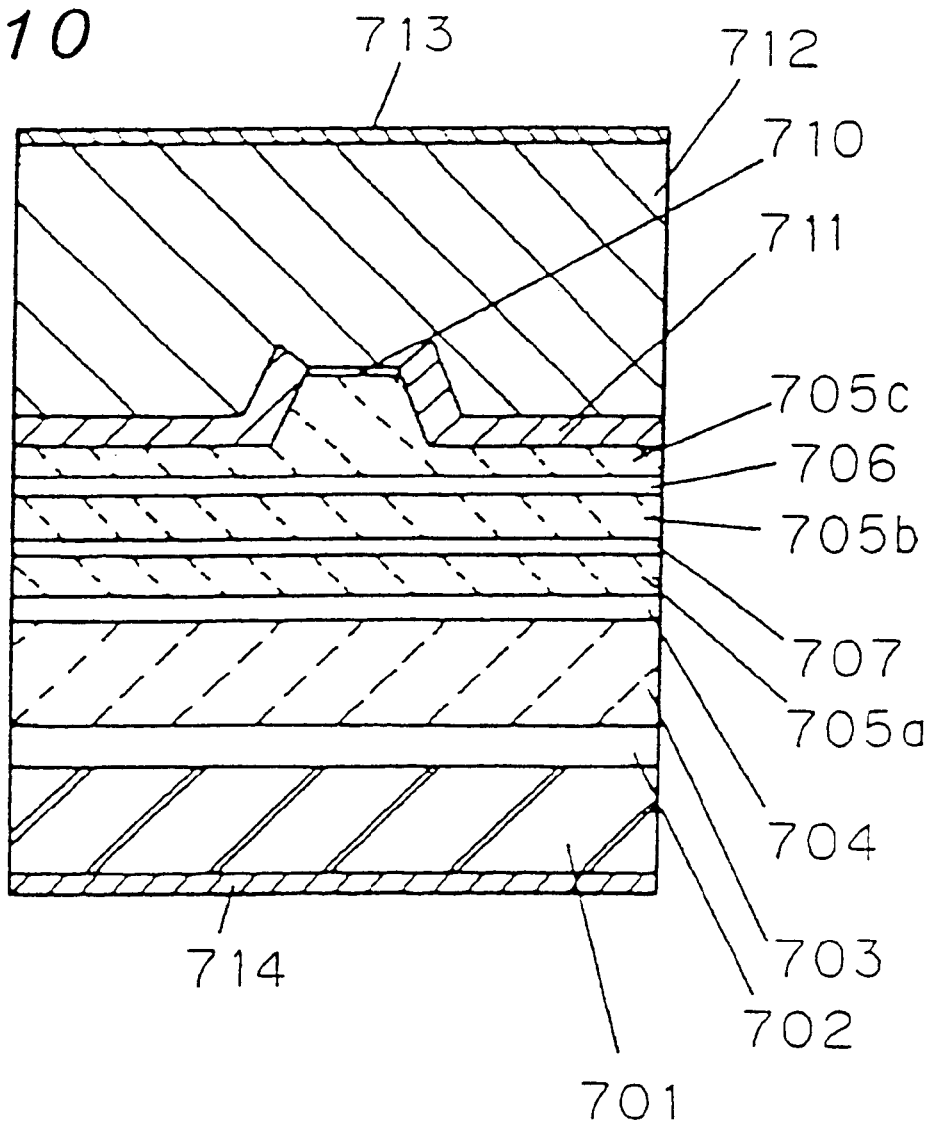
FIG. 10 is a sectional view of the second example of the semiconductor laser according to the present invention.

A second example of the semiconductor laser according to the present invention will be described with reference of FIG. 10. The semiconductor laser of this example includes an n-type GaAs substrate 701 and a semiconductor multilayer structure formed on the GaAs substrate 701. The semiconductor multilayer structure includes an n-type GaAs buffer layer 702, an n-type AlGaInP cladding layer 703, a multiple quantum well active layer 704 made of AlGaInP and GaInP, a first p-type AlGaInP cladding layer 705a, an optical guide layer 707, a second p-type AlGaInP cladding layer 705b, a saturable absorption layer 706 made of p-type GaInP, and a third p-type AlGaInP cladding layer 705c. A stripe ridge (width: 2.0 to 7.0 $\mu$m) extending in a cavity length direction is formed in the upper portion of the third p-type AlGaInP cladding layer 705c. A contact layer 710 is formed on the top surface of the ridge of the third p-type cladding layer 705c. An n-type GaAs current blocking layer 711 is formed on the third p-type cladding layer 705c and the sides of the contact layer 710. A p-type GaAs cap layer 712 is formed over the contact layer 710 and the current blocking layer 711. A p-electrode 713 is formed on the top surface of the cap layer 712, while an n-electrode 714 is formed on the bottom surface of the substrate 701. The active layer 704 is of a multiple quantum well structure composed of three pairs of a well layer and a barrier layer.

In this example, the n-type AlGaInP cladding layer 703, the first p-type AlGaInP cladding layer 705a, the optical guide layer 707, the second p-type AlGaInP cladding layer 705b, the saturable absorption layer 706, and the third p-type AlGaInP cladding layer 705c constitute the cladding structure. The semiconductor laser of this example is different from that of the previous example in that the optical guide layer 707 is formed in the cladding structure as will be described later in detail.

Figure 11:
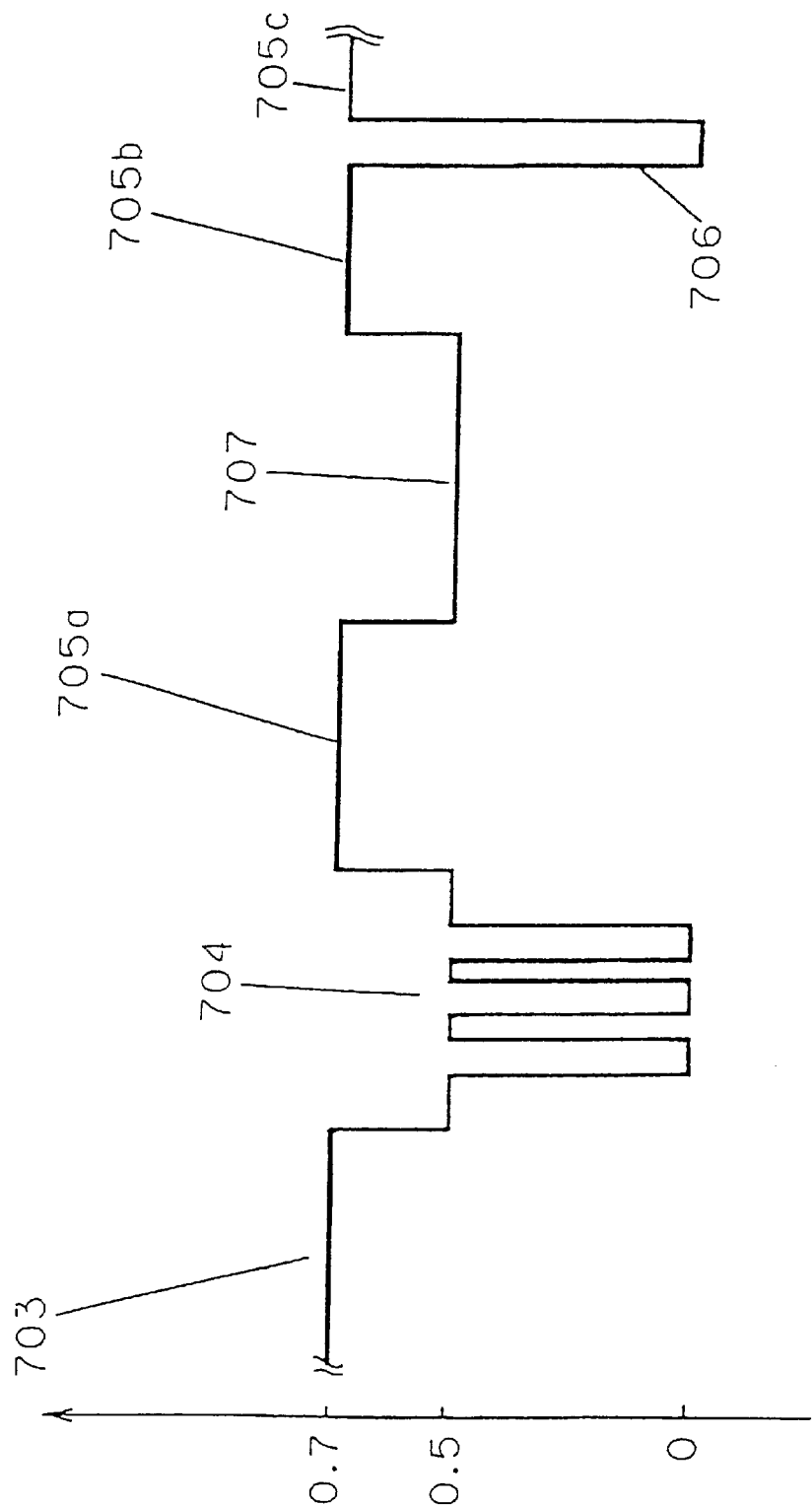
FIG. 11 is a band gap energy diagram of the second example.

FIG. 11 shows the distribution of an Al mole fraction x of $(Al_xGa_{1-x})_{0.5}In_{0.5}P$ in the portions of the semiconductor laser of this example covering the n-type cladding layer 703 to the third p-type cladding layer 705c. In this example, the Al mole fraction of the n-type cladding layer, the first p-type cladding layer, the second p-type cladding layer, the third p-type cladding layer, and the optical guide layer is 0.5. The well layers of the active layer 704 and the saturable absorption layer 706 are made of $Ga_{0.45}In_{0.55}P$ and $Ga_{0.40}In_{0.60}P$, respectively.

In this example, also, the difference between the ground states of the saturable absorption layer and the well layers (energy gap difference) is set at 57 meV. In order to obtain stable self-oscillation of the semiconductor laser with the configuration shown in FIG. 10, the energy gap difference is required to be in the range of 30 to 200 meV, preferably in the range of 50 to 100 meV.

A feature of the semiconductor laser of this example is that the optical guide layer is formed in the cladding structure while the volume of the saturable absorption layer is reduced. As the volume of the saturable absorption layer is smaller, the carrier density of the layer can be increased more easily. As the carrier density is higher, the light absorption is saturated more easily, exhibiting even better saturable absorption effect. Thus, as the volume of the saturable absorption layer is smaller, stronger self-oscillation is obtained. As the volume of the saturable absorption layer is reduced, however, the confinement factor of the saturable absorption layer lowers. In this example, in order to overcome this problem, the optical guide layer is formed between the active layer and the saturable absorption layer, so that the distribution of laser light can be expanded from the active layer toward the saturable absorption layer, thereby increasing the confinement factor of the saturable absorption layer and enhancing the interaction between the saturable absorption layer and light. Thus, the optical guide layer in this example is provided to enhance the confinement factor of the saturable absorption layer, which differs greatly in the function from conventional optical guide layers provided to enhance the confinement factor of the active layer.

Figure 12A:
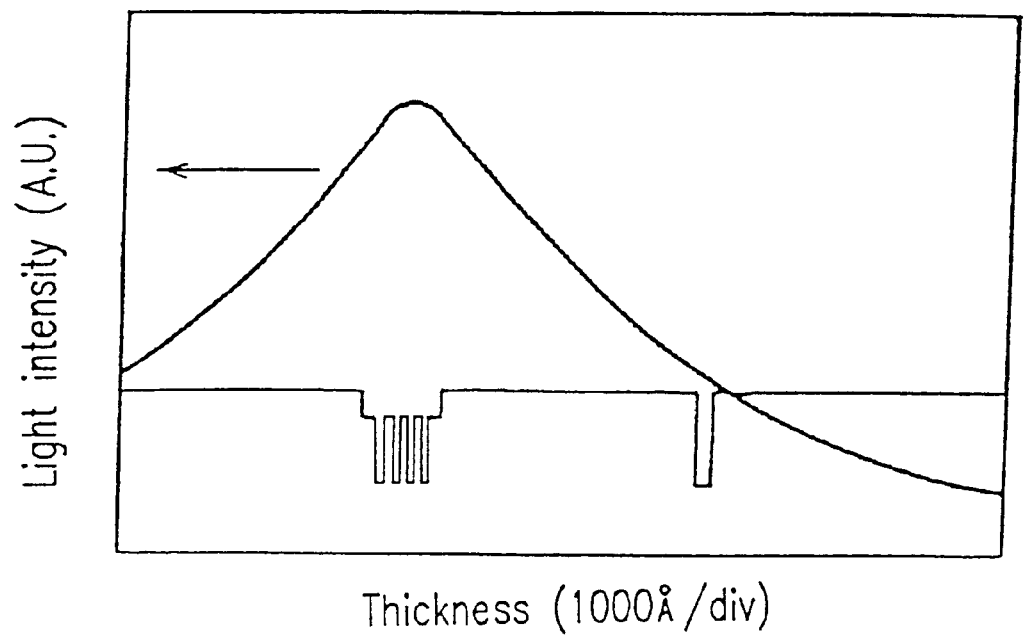
FIG. 12A is a light intensity distribution diagram obtained when an optical guide layer is not formed.
Figure 12B:
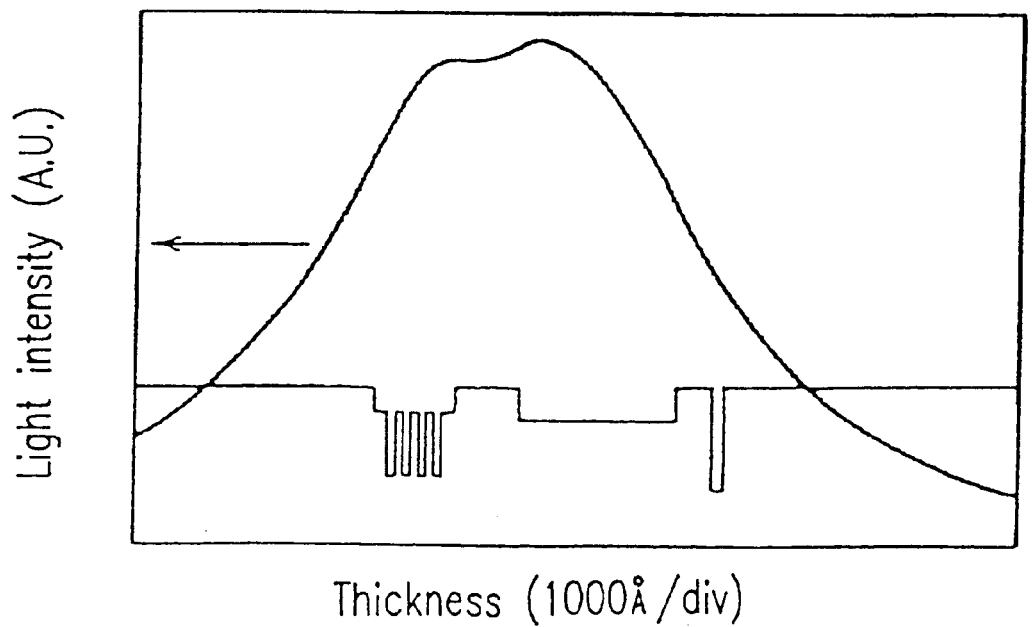
FIG. 12B is a light intensity distribution diagram obtained when an optical guide layer is formed.

Next, referring to FIGS. 12A, 12B, and 13, the function of the optical guide layer in this example will be described in detail. FIGS. 12A and 12B show the light intensity distributions obtained when no optical guide layer is provided and when an optical guide layer is provided, respectively. As observed from FIG. 12B, two peaks of light intensity appear by forming a semiconductor layer with a relatively smaller energy gap (higher refractive index) compared with other portions of the cladding structure, as the optical guide layer, at a position apart from the active layer. In other words, the confinement factor in both the active layer and the optical guide layer is achieved, allowing light to be effectively distributed to the saturated absorption layer.

Figure 13:
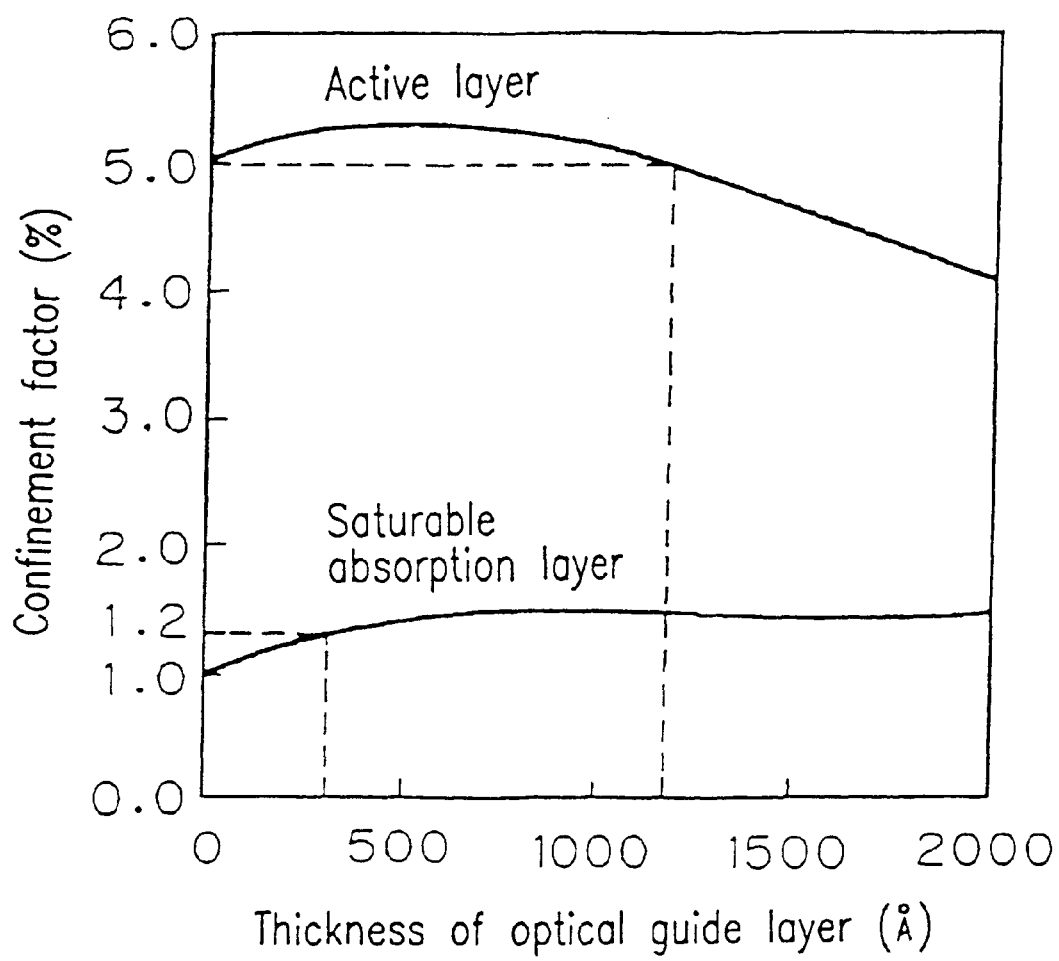
FIG. 13 is a characteristics diagram illustrating the confinement factor of the second example.

FIG. 13 is a graph showing the dependency of the confinement factor upon the thickness of the optical guide layer. The X axis of this graph represents the thickness of the optical guide layer (Å), and the Y axis thereof represents the confinement factor (%). The "confinement factor" of a layer as used herein means the percentage of light existing within the layer of the total light amount.

It has been found from the experiment results that, in order to obtain stable self-oscillation characteristics, the confinement factors of the active layer and the saturable absorption layer are required to be 5% or more and 1.2% or more, respectively. In order to obtain the above confinement factors, the thickness of the optical guide layer should be in the range of 300 to 1200 Å. Thus, by forming the optical guide layer in the cladding structure, stable self-oscillation characteristics can be obtained as in the case of the semiconductor laser of Example 1.

Figure 14:
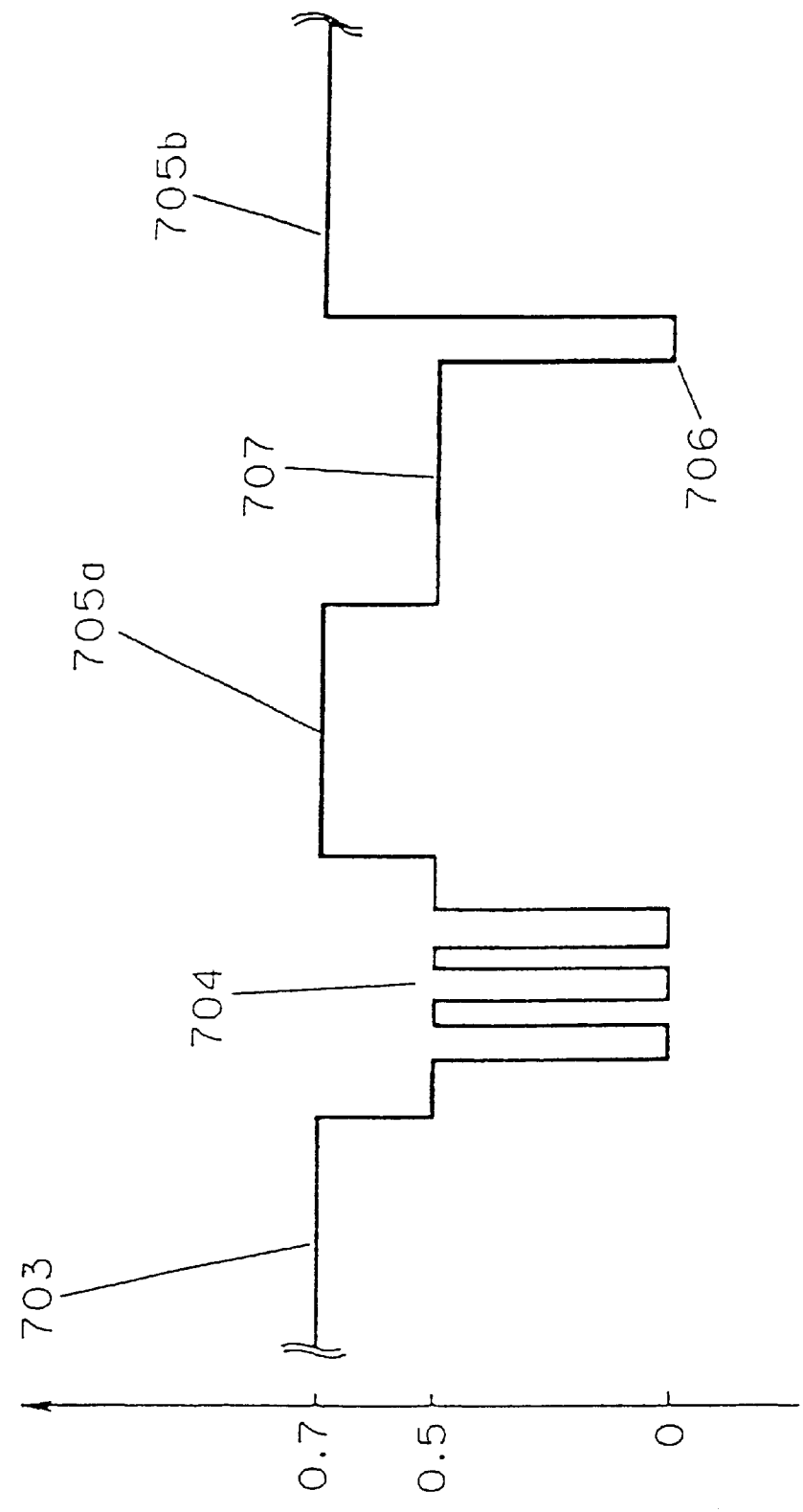
FIG. 14 is a band gap energy diagram of another example of the semiconductor laser according to the present invention.

In this example, the saturable absorption layer is formed at a position apart from the optical guide layer. Alternatively, it may be formed inside the optical guide layer as shown in FIG. 14. In this case, also, self-oscillation can be obtained by forming the saturable absorption layer inside the optical guide layer so that the confinement factor of the saturable absorption layer is 1.2% or more.

In Examples 1 and 2, the active layer is of the multiple quantum well structure. A semiconductor layer with the stable self-oscillation characteristics can also be realized using an active layer of a single quantum well structure. In this case, the energy gap difference between the ground states of the quantum well layer and the saturable absorption layer should be in the range of 30 to 200 meV, especially in the range of 50 to 100 meV. The effect of the present invention can also be obtained by a semiconductor laser invention including a bulk type active layer having no quantum well as long as the energy gap difference is set at a value within the above range.

Figure 15:
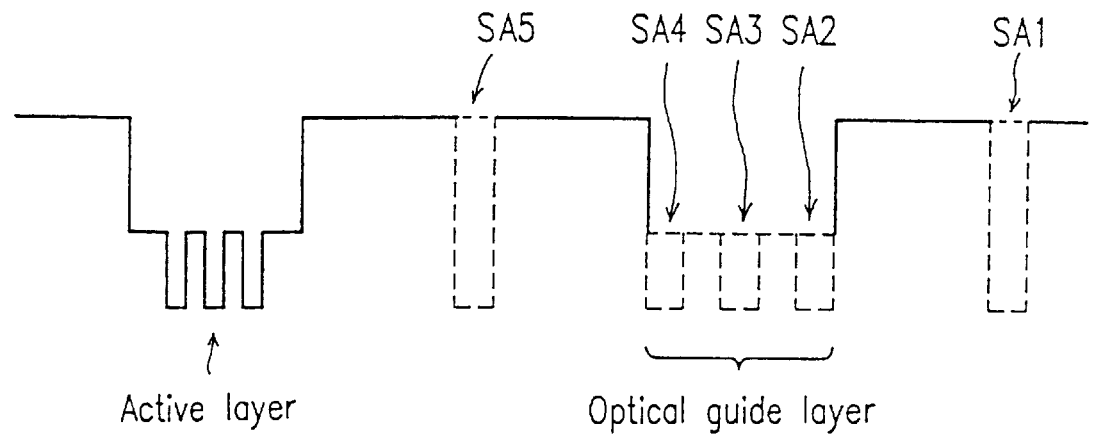
FIG. 15 is a band gap energy diagram illustrating the positional relationship between a saturable absorption layer and an optical guide layer according to the present invention.

The positional relationship between the optical guide layer and the saturable absorption layer is not limited to that in Example 2 where the optical guide layer is formed between the saturable absorption layer and the active layer. Referring to FIG. 15, the positional relationship between the optical guide layer and the saturable absorption layer will be described. In FIG. 15, the saturable absorption layer may be formed at any of positions SA1 to SA5 shown by dotted lines.

The position SA1 corresponds to the position of the saturable absorption layer adopted in Example 2. While the position SA1 is apart from the optical guide layer, the saturable absorption layer may be formed adjacent to the optical guide layer. The positions SA2 to SA4 indicate the positions of the saturable absorption layer formed inside the optical guide layer. The position SA5 indicates the position of the saturable absorption layer formed between the optical guide layer and the active layer. Though the position SA5 is apart from the optical guide layer, the saturable absorption layer may be adjacent to the optical guide layer.

When the saturable absorption layer is formed inside the optical guide layer, the ground state of the saturable absorption layer slightly varies from that obtained when the saturable absorption layer is formed outside the optical guide layer because the respective height of the barrier of the quantum well in each case, as viewed from the saturable absorption layer, are different from each other.

In the case where the saturable absorption layer is doped with impurities at high density, the impurities in the saturable absorption layer may adversely affect the active layer if the saturable absorption layer is formed near the active layer. To avoid this trouble, the saturable absorption layer is preferably formed apart from the active layer by a distance of 200 Å or more when the saturable absorption layer with an impurity density of $1 \times 10^{18}$ $cm^{-3}$ or more is formed.

A plurality of saturable absorption layers may be formed. For example, saturable absorption layers may be formed at two or more of the positions SA1 to SA5 shown in FIG. 15. Alternatively, the saturable absorption layer may be of the multiple quantum well structure. As a result of a plurality of saturable absorption layers formed in the cladding structure, however, the total volume of the saturable absorption layers increases, lowering the carrier density of the saturable absorption layers. If a plurality of saturable absorption layers made of a material with a comparatively large refractive index are formed close to one another, light tends to be confined in the portion where the saturable absorption layers are closely formed. This lowers the necessity of forming an optical guide layer.

Figure 16:
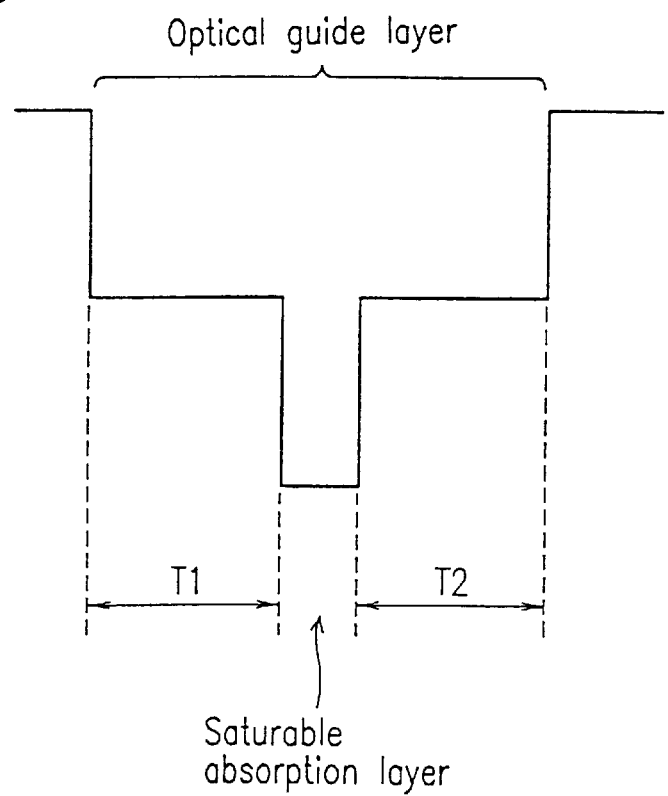
FIG. 16 is a band gap energy diagram obtained when the saturable absorption layer is formed in the optical guide layer.

Alternatively, a plurality of optical guide layers may be formed separately. For example, a pair of optical guide layers may be formed to sandwich the saturable absorption layer. If the pair of optical guide layers are formed in contact with the saturable absorption layer, the resultant structure is the same as that obtained when the saturable absorption layer is formed at the position SA3 in FIG. 15. This can be expressed as the structure where the saturable absorption layer is formed inside the optical guide layer. Incidentally, the thickness of the optical guide layer with the saturable absorption layer formed therein should be the sum of a thickness T1 of a first optical guide portion and a thickness T2 of a second optical guide portion shown in FIG. 16.

EXAMPLE 3

Hereinbelow, a chip inspection process according to the present invention will be described.

In general, a plurality of semiconductor laser elements are formed from one semiconductor wafer. More specifically, after a p-type electrode and an n-type electrode are formed on both surfaces of a semiconductor wafer, the semiconductor wafer is cleaved to obtain a plurality of bars. The cleaved face of each bar is coated with a reflective film.

In a chip inspection process, a semiconductor laser element having characteristics which are not within a predetermined allowance is discarded as being defective. For example, when a semiconductor laser element as a chip is pulse-driven at room temperature, it is discarded as being defective if the threshold current thereof is not within the range of 100 to 200 mA.

Then, each of laser chips which have passed the chip inspection process is sealed in a can and subjected to an assembling process.

An aging process is then conducted. The inventors of the present invention have found that, for a semiconductor laser element having a saturable absorption layer doped with p-type impurities, the characteristics of the semiconductor laser element obtained at the start of the oscillation are different from those obtained one minute or more after the start of oscillation. It has also been found that the characteristics are stabilized several minutes after the start of laser oscillation. More specifically, the characteristics remain in a substantially fixed state about ten minutes after the start of the laser oscillation. For example, it is assumed that the semiconductor laser is driven under the condition of outputting a fixed light power. At this time, while it operates at a driving current of about 100 mA immediately after the start of oscillation, it changes to operate at a driving current of about 70 mA after the lapse of 1 to 10 minutes, in some cases.

The above variation in the characteristics occurs within a comparatively short period of time after the start of laser oscillation, and it hardly occurs after the lapse of this period. This variation in the characteristics is therefore called herein the "initial variation in characteristics".

In a device or a system including a semiconductor laser element as a light source, the operating current of the semiconductor laser element should preferably not vary. Accordingly, prior to distribution of semiconductor laser elements of the present invention, a process for stabilizing the characteristics (for example, the threshold current), i.e., the aging process, should be preferably conducted. The aging process may be a process where the semiconductor laser element is consecutively oscillated at room temperature for 1 to 120 minutes, or a process where it is pulse-oscillated at 50° C. for 1 to 120 minutes. This aging process should be conducted after the chip assembling process.

It has been found that the characteristics of the semiconductor laser element can be stabilized by annealing the semiconductor wafer at 300 to 800° C. for about 10 to 60 minutes before the semiconductor wafer is separated into a plurality of bars, instead of the aging process. This annealing process enables the characteristics of the semiconductor laser element to be stabilized while it is in the wafer state before the assembling process. By testing and discarding the defective element before the assembling process in this manner, a wasteful process of assembling a defective element is eliminated. Moreover, the process can be conducted for a plurality of semiconductor laser elements simultaneously, not for the individual semiconductor laser elements. Alternatively, this annealing process for stabilizing the characteristics may be conducted after the separation of the wafer into laser bars.

The above-mentioned aging process and the annealing process are particularly effective for a saturable absorption layer doped with p-type impurities (especially, Zn) at high density.

In any of the above examples, AlGaInP type semiconductor laser elements were specifically described. The present invention is not limited to this type of semiconductor laser. For example, the present invention is also applicable to $Al_xGa_{1-x}As$ ($0 \leq x \leq 1$) type, $Al_xGa_yIn_{1-x-y}N$ ($0 \leq x \leq 1$, $0 \leq y \leq 1$) type, and $Mg_xZn_{1-x}S_ySe_{1-y}$ ($0 \leq x \leq 1$, $0 \leq y \leq 1$) type semiconductor laser elements. Using any of these types of materials, stable self-oscillation can be attained by forming a saturable absorption layer doped with impurities of $1 \times 10^{18}$ cm$^{-3}$ or more.

In the case of an $Al_xGa_{1-x}As$ ($0 \leq x \leq 1$) type semiconductor laser element, the active layer is made of $Al_{0.1}Ga_{0.9}As$, the saturable absorption layer is made of GaAs, and the cladding layers are made of AlGaAs, for example.

In the case of an $Al_xGa_yIn_{1-x-y}N$ ($0 \leq x \leq 1$, $0 \leq y \leq 1$) type semiconductor laser element, the active layer is made of $In_{0.05}Ga_{0.95}N$, the saturable absorption layer is made of $In_{0.2}Ga_{0.8}N$, and the cladding layers are made of $Al_{0.1}Ga_{0.9}N$, for example.

In the case of a $Mg_xZn_{1-x}S_ySe_{1-y}$ ($0 \leq x \leq 1$, $0 \leq y \leq 1$) type semiconductor laser element, the active layer is made of $Cd_{0.2}Zn_{0.8}Se$, the saturable absorption layer is made of $Cd_{0.3}Zn_{0.7}Se$, and the cladding layers are made of $Mg_{0.1}Zn_{0.9}S_{0.1}Se_{0.9}$, for example.

EXAMPLE 4

An optical disk device according to the present invention will be described with reference to FIG. 17.

Figure 17:
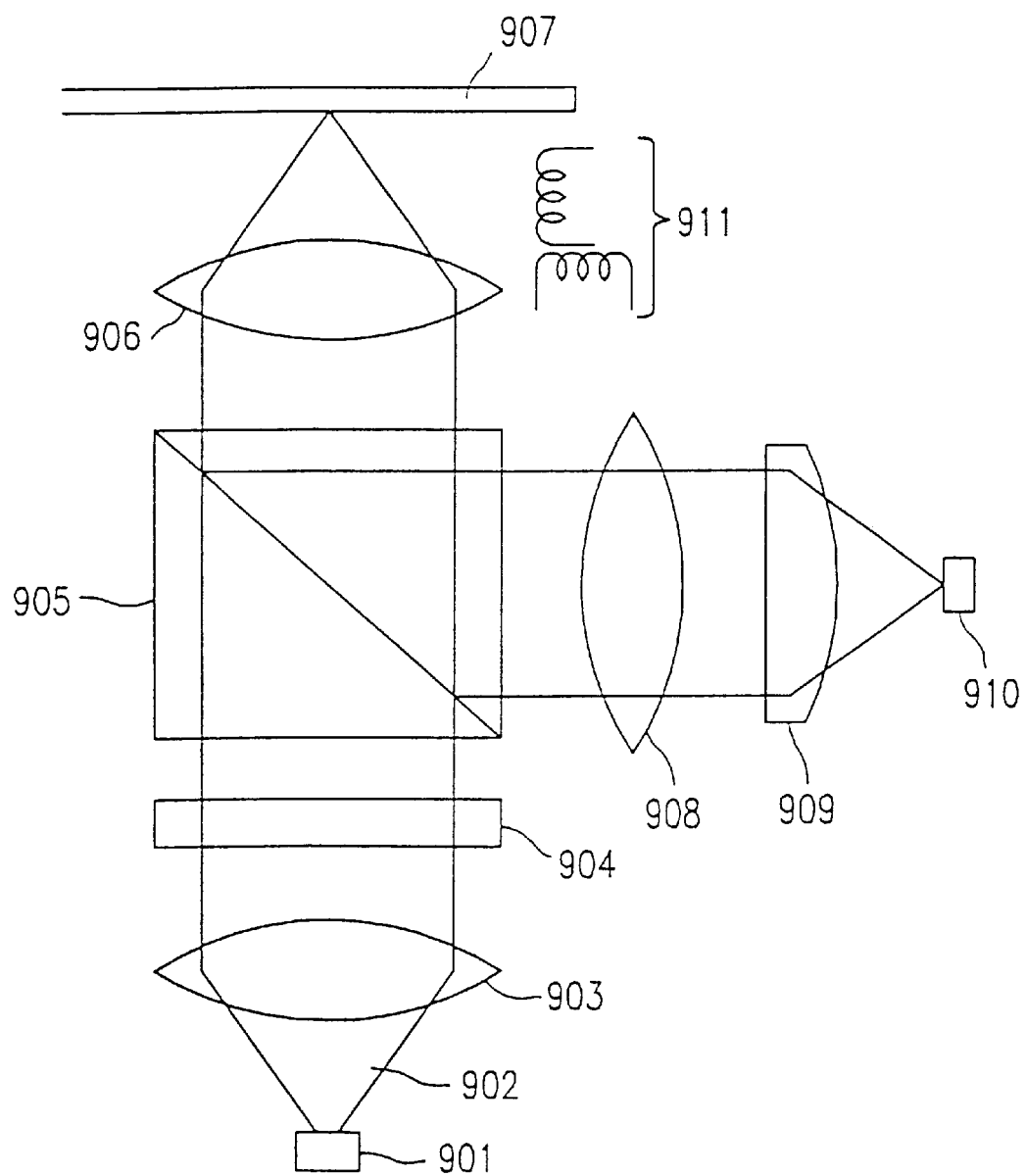
FIG. 17 is a view schematically illustrating an example of the optical disk device according to the present invention.

The optical disk device of this example includes a semiconductor laser element 901 of the present invention described above, a collimator lens 903 for collimating a laser beam 902 (wavelength: 650 nm) emitted from the semiconductor laser element 901, a diffraction grating 904 for splitting the parallel beam into three laser beams (only one laser beam is shown in FIG. 17), a half prism 905 for allowing a specific component of the laser beam to transmit therethrough or be reflected therefrom, and a condenser lens 906 for converging the laser beam output from the half prism 905 on an optical disk 907. A laser beam spot with a diameter of about 1 μm, for example, is formed on the optical disk 907. As the optical disk 907, not only a read only disk but also a rewritable disk can be used.

The laser beam reflected from the optical disk 907 is first reflected from the half prism 905, passes through a light receiving lens 908 and a cylindrical lens 909, and is incident on a light receiving element 910. The light receiving element 810 includes a photodiode divided into a plurality of portions, and generates an information reproduction signal, tracking signal, and a focusing error signal based on the laser beam reflected from the optical disk 907. A driving system 811 drives the optical system based on the tracking signal and the focusing error signal, so as to adjust the position of the laser beam spot on the optical disk 907.

Known elements may be used as the above components of the optical disk device of this example, except for the semiconductor laser 901. As described above, the semiconductor laser element 901 of this example includes the saturable absorption layer doped with impurities at high density. With such a saturable absorption layer, low-level relative intensity noise can be kept low even when part of the laser beam reflected form the optical disk 907 returns to the semiconductor laser element 901 after passing through the half prism 905 and the diffraction grating 904.

The semiconductor laser element shown in FIG. 2 exhibits self-oscillation until the light output power reaches the level of about 10 mW. As the light output power is increased beyond the level, the oscillation gradually shifts from the self-oscillation to a single mode oscillation. For example, the self-oscillation no more occurs when the light output power is about 15 mW. When information is reproduced from the optical disk, the semiconductor laser element should be in the state of self-oscillation where no return light noise arises. When information is recorded on the optical disk, however, self-oscillation is not necessary. Thus, not only low-distortion reproduction of information but also recording is possible by recording information with a light output power of about 15 mW and reproducing information with a light output power of about 5 mW, for example.

As described above, in the optical disk device of the present invention, low-distortion reproduction can be attained with a wavelength in the range of 630 to 680 nm without using a circuit component for high-frequency superimposition.

In contrast, stable self-oscillation cannot be obtained by the conventional AlGaInP type semiconductor lasers with a wavelength of 630 to 680 nm. When such a conventional AlGaInP type semiconductor laser is used for an optical disk device, it is required to superimpose high frequency on a driving current to suppress the return noise. This necessitates a large-scale high-frequency superimposing circuit, which is disadvantageous for size reduction of the optical disk device.

EXAMPLE 5

Another optical disk device according to the present invention will be described.

The optical disk device of this example uses a laser unit including the semiconductor laser element according to the present invention described above. Specifically, the laser unit includes a silicon substrate having photodiodes and a semiconductor laser element mounted on the silicon substrate. A micromirror is formed on the silicon substrate for reflecting a laser beam emitted from the semiconductor laser element.

Figure 18:
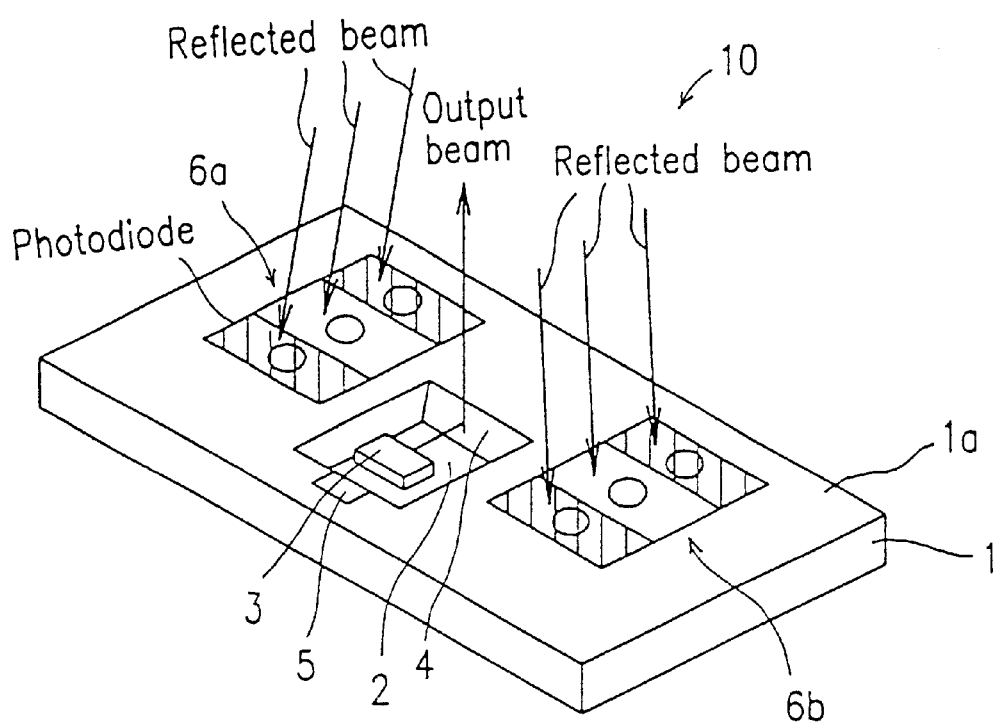
FIG. 18 is a perspective view of a laser unit used for the optical disk device according to the present invention.

Referring to FIG. 18, the laser unit will be described. A concave portion 2 is formed in the center of a principal surface 1a of a silicon substrate 1 (7 mm×3.5 mm), and a semiconductor laser element 3 is disposed on the bottom surface of the concave portion 2. A side wall of the concave portion 2 is tilted to serve as a micromirror 4. If the principal surface 1a of the silicon substrate 1 was the (100) orientation, a (111) plane may be exposed by anisotropy etching to be used as the micromirror 4. Since the (111) plane is tilted from the (100) plane by 54°, a (111) plane tilted from the principal surface 1a by 45° can be obtained by using an off-substrate tilted from the (100) plane by 9° in a <110> direction. Another (111) plane formed opposite the above (111) plane tilts from the principal surface 1a by 63°. No micromirror 4 is formed in this plane, but a photodiode for monitoring light output power is formed as will be described later. The (111) plane formed by anisotropy etching is a smooth mirror face, serving as the excellent micromirror 4. In order to enhance the reflection efficiency of the micromirror 4, a metal film which is not likely to absorb laser light is preferably formed on at least the tilted plane of the silicon substrate 1.

In addition to the photodiode 5 for monitoring light output power from the semiconductor laser 3, five-divided photodiodes 6a and 6b for light signal detection are also formed on the silicon substrate 1.

Figure 19:
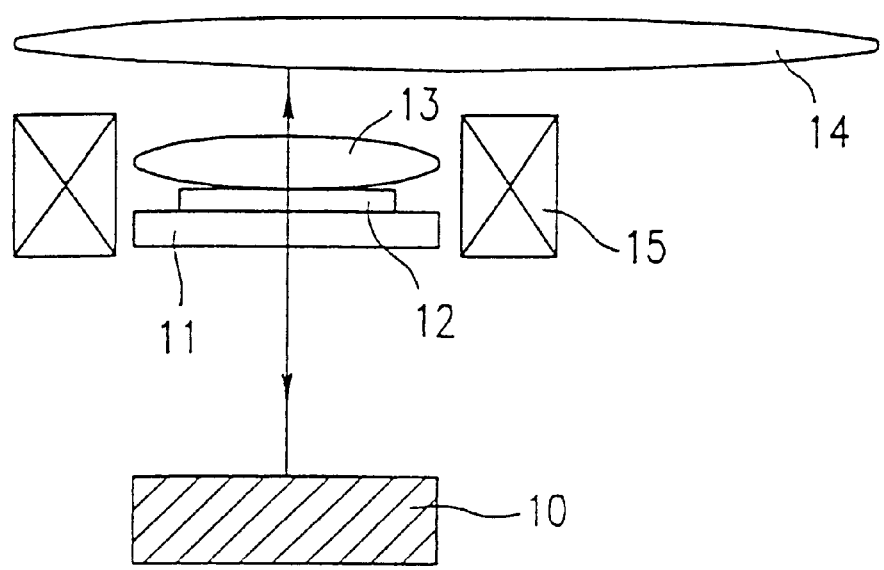
FIG. 19 is a view schematically illustrating another example of the optical disk device according to the present invention.
Figure 20:
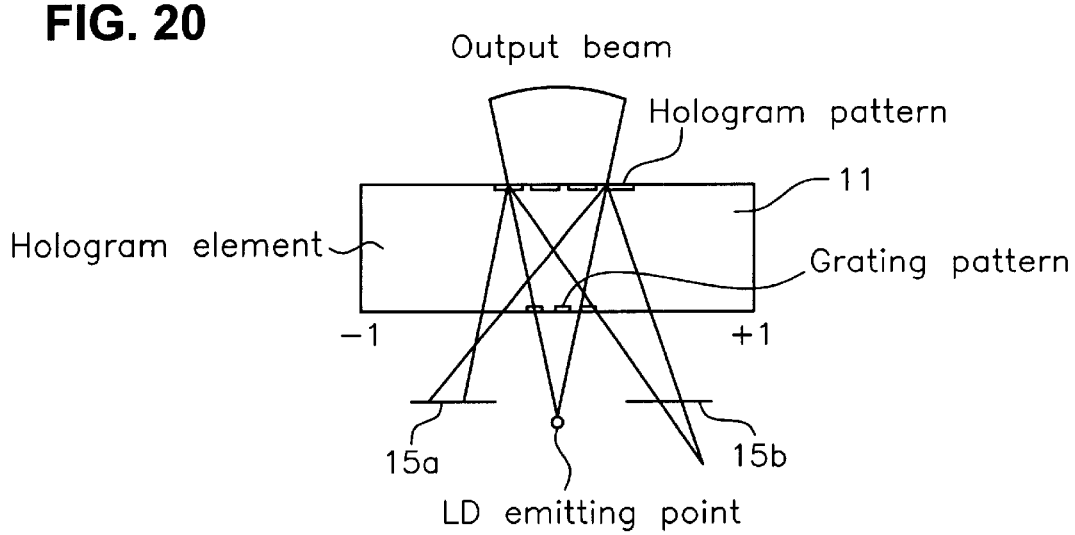
FIG. 20 is a diagram illustrating the operation of a hologram element used for the optical disk device according to the present invention.

Now, referring to FIG. 19, the optical disk device of this example will be described. A laser beam emitted from the semiconductor laser element (not shown in FIG. 19) of the laser unit 10 with the above-described structure is reflected from the micromirror (not shown in FIG. 19) and then split into three beams by a grating formed on the bottom surface of a hologram element 11 (only one beam is shown in FIG. 19 for simplification). Then, the laser beam passes through a quarter wave plate (¼ λ plate) 12 and an objective lens 13 to be converged on an optical disk 14. The laser beam reflected from the optical disk 14 passes through the objective lens 13 and the ¼ λ plate 12, and then diffracted by a grating formed on the top surface of the hologram element 11. This diffraction forms a minus first-order beam and a plus first-order beam as shown in FIG. 20. For example, the minus first-order beam irradiates a light receiving surface 15a located left in FIG. 20, while the plus first-order beam irradiates a light receiving surface 15b located right in FIG. 20. The pattern of the grating formed on the top surface of the hologram element 11 is adjusted so that the minus first-order beam and the plus first-order beam have different focal distances.

Figure 21A:
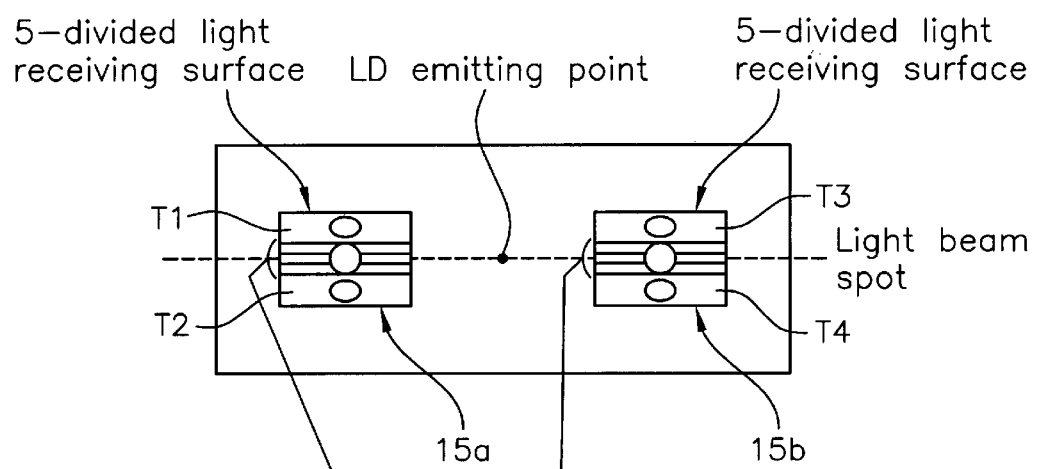
FIGS. 21A and 21B are plan views of optical detectors used for the optical disk device according to the present invention.
Figure 21B:
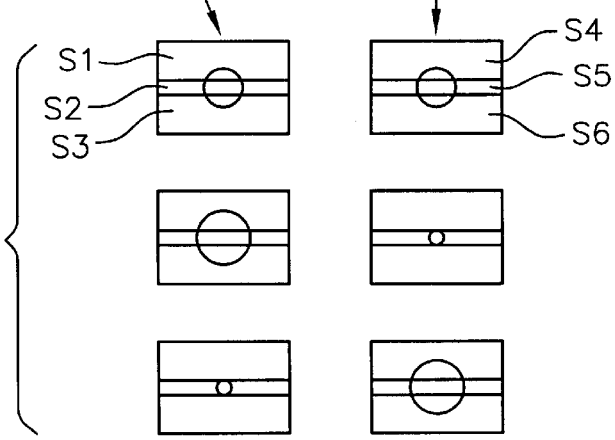

As shown in FIGS. 21A and 21B, when the laser beam is focused on the optical disk, the shape of a spot of the reflected laser beam formed on the light receiving surface 15a of the laser unit 10 is the same as the shape of a spot of the reflected laser beam formed on the light receiving surface 15b. When the laser beam is not focused on the optical disk, however, the shape of the spot of the reflected laser beam formed on the light receiving surface 15a is different from that formed on the light receiving surface 15b.

The sizes of the light spots thus formed on the right and left light receiving surfaces are detected as a focusing error signal FES obtained by expression below:

$$FES=(S1+S3+S5)-(S2+S4+S6)$$

wherein S1 to S3 denote signal intensities output from three center photodiodes of total five photodiodes constituting the light receiving surface 15a, and S4 to S6 denote signal intensities output from three center photodiodes of total five photodiodes constituting the light receiving surface 15b. When the focusing error signal FES is zero, the laser beam is focused on the optical disk (on focus). The objective lens 13 is driven by an actuator 15 shown in FIG. 19 appropriately so that the focusing error signal FES becomes zero.

A tracking error signal TES is determined by expression below:

$$TES=(T1-T2)+(T3-T4)$$

wherein T1 and T2 denote the signal intensities output from two outermost photodiodes of the total five photodiodes constituting the light receiving surface 15a, and T3 and T4 denote the signal intensities output from two outermost photodiodes of the total five photodiodes constituting the light receiving surface 15b.

An information signal RES is determined by expression below:

$$RES=(S1+S3+S5)+(S2+S4+S6)$$

In this example, the laser unit where the semiconductor laser element and the photodiodes are integrally formed is used. However, these elements may be individually formed.

The size of the optical disk device can be reduced by using the laser unit where the semiconductor laser and the photodiodes are integrally formed. Moreover, since the photodiodes and the micromirror are preformed in the silicon substrate, only the semiconductor laser element is required to be optically aligned with respect to the silicon substrate. With this easy optical alignment, the assembling precision increases and the production process can be simplified.

INDUSTRIAL APPLICABILITY

According to the present invention, by setting the energy gap difference to be in the range of 30 to 200 meV, the saturable absorption layer absorbs light efficiently and the light absorption is saturated. This makes it possible to provide stable self-oscillation. In particular, the saturation condition of the saturable absorption layer is optimal and the operating current does not increase when the energy gap difference is in the range of 50 to 100 meV, providing good self-oscillation characteristics. Moreover, by forming an optical guide layer, the carrier density of the saturable absorption layer can be easily increased even when the volume thereof is small, providing strong and stable self-oscillation characteristics. Thus, a light source suitable for next-generation large-capacity light information recording can be provided.

The optical disk device including such a semiconductor laser is free from intensity noise caused by return of light reflected from the disk surface and temperature change, and thus signal read errors are reduced, providing great significance to the industry.

What is claimed is:

1. A method for fabricating a semiconductor laser comprising an active layer having a quantum well layer and a cladding structure sandwiching the active layer, the cladding structure including a saturable absorption layer and an optical guide layer for increasing a confinement factor of the saturable absorption layer, an energy gap of the saturable absorption layer being smaller than an energy gap between ground states of the quantum well layer of the active layer by 30 to 200 meV, characteristics of the semiconductor laser varying with time but being substantially fixed after a lapse of about one minute, wherein the method comprises a stabilizing step for varying the characteristics obtained immediately after start of laser oscillation to obtain the substantially fixed characteristics.

2. A method for fabricating a semiconductor laser according to claim 1, wherein the characteristics are current-light output power characteristics.

3. A method for fabricating a semiconductor laser comprising an active layer having a quantum well layer and a cladding structure sandwiching the active layer, the cladding structure including a saturable absorption layer and an optical guide layer for increasing a confinement factor of the saturable absorption layer, an energy gap of the saturable absorption layer being smaller than an energy gap between ground states of the quantum well layer of the active layer by 30 to 200 meV, characteristics of the semiconductor laser varying with time but being substantially fixed after a lapse of about one minute, wherein the method comprises a step of reducing a threshold current by an aging process for varying the characteristics obtained immediately after start of laser oscillation to obtain the substantially fixed characteristics.

4. A method for fabricating a semiconductor laser comprising an active layer having a quantum well layer and a cladding structure sandwiching the active layer, the cladding structure including a saturable absorption layer and an optical guide layer for increasing a confinement factor of the saturable absorption layer, an energy gap of the saturable absorption layer being smaller than an energy gap between ground states of the quantum well layer of the active layer by 30 to 200 meV, characteristics of the semiconductor laser varying with time but being substantially fixed after a lapse of about one minute, wherein the method comprises a step of reducing a threshold current by annealing for varying the characteristics obtained immediately after start of laser oscillation to obtain the substantially fixed characteristics.

5. A method for fabricating a semiconductor laser comprising an active layer having a quantum well layer and a cladding structure sandwiching the active layer, the cladding structure including a saturable absorption layer and an optical guide layer for increasing a confinement factor of the saturable absorption layer, an energy gap of the saturable absorption layer being smaller than an energy gap between ground states of the quantum well layer of the active layer by 30 to 200 meV, characteristics of the semiconductor laser varying with time but being substantially fixed after a lapse of about one minute, wherein the method comprises a stabilizing step for varying the characteristics obtained immediately after start of laser oscillation to obtain the substantially fixed characteristics, wherein a threshold current is reduced from a value obtained immediately after the start of laser oscillation by 5 mA or more by the stabilizing step.

* * * * *